(12) United States Patent
Kasztenny et al.

(10) Patent No.: US 10,677,834 B2
(45) Date of Patent: Jun. 9, 2020

(54) DISTANCE PROTECTION OF ELECTRIC POWER DELIVERY SYSTEMS USING TIME DOMAIN AND FREQUENCY DOMAIN

(71) Applicant: Schweitzer Engineering Laboratories, Inc., Pullman, WA (US)

(72) Inventors: Bogdan Z. Kasztenny, Markham (CA); Mangapathirao Venkata Mynam, Pullman, WA (US); Chadburn Troy Daniels, Moscow, ID (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 93 days.

(21) Appl. No.: 16/132,117

(22) Filed: Sep. 14, 2018

(65) Prior Publication Data

US 2020/0088780 A1  Mar. 19, 2020

(51) Int. Cl.
*G01R 31/08* (2020.01)
*H02H 1/00* (2006.01)
*H02H 3/26* (2006.01)

(52) U.S. Cl.
CPC ......... *G01R 31/086* (2013.01); *G01R 31/088* (2013.01); *H02H 1/0007* (2013.01); *H02H 3/26* (2013.01)

(58) Field of Classification Search
CPC ...... G01R 31/086; G01R 31/088; H02H 3/26; H02H 1/0007
USPC .......................................................... 361/78
See application file for complete search history.

(56) References Cited

U.S. PATENT DOCUMENTS

| | | |
|---|---|---|
| 3,585,298 A | 6/1971 | Liberman |
| 3,670,240 A | 6/1972 | Maranchak |
| 3,878,460 A | 4/1975 | Nimmersjö |
| 3,890,544 A | 6/1975 | Chamia |
| 3,956,671 A | 5/1976 | Nimmersjö |
| 4,053,816 A | 10/1977 | Nimmersjö |
| 4,063,162 A | 12/1977 | Lanz |
| 4,063,164 A | 12/1977 | Lanz |
| 4,063,165 A | 12/1977 | Lanz |

(Continued)

FOREIGN PATENT DOCUMENTS

| | | |
|---|---|---|
| EP | 226210 | 12/1986 |
| EP | 241832 | 7/1990 |

(Continued)

OTHER PUBLICATIONS

Harshad Mehta, Fault Location Techniques for High-Voltage DC Lines, EPRI EL-4331 Project 2150-1, 1985.

(Continued)

*Primary Examiner* — Dharti H Patel
(74) *Attorney, Agent, or Firm* — Richard M. Edge

(57) ABSTRACT

Distance protection of electric power delivery systems are disclosed herein where a fault within a zone of protection is detected using time-domain fault detection supervised by frequency-domain fault detection. The distance fault detection may be asserted when the real or imaginary parts of the time-domain operating and polarizing quantities are both positive or both negative and an angle between the frequency domain operating and polarizing quantities is within a predetermined range. Additional security may be provided using a level check, a sign consistency check, or a disturbance detector.

21 Claims, 13 Drawing Sheets

(56) References Cited

U.S. PATENT DOCUMENTS

| | | |
|---|---|---|
| 4,165,482 A | 8/1979 | Gale |
| 4,183,072 A | 1/1980 | Takagi |
| 4,251,770 A | 2/1981 | Schweitzer, Jr. |
| 4,254,444 A | 3/1981 | Erikson |
| 4,296,452 A | 10/1981 | Eriksson |
| 4,342,064 A | 7/1982 | Wilkinson |
| 4,344,142 A | 8/1982 | Diehr |
| 4,351,011 A | 9/1982 | Liberman |
| 4,371,907 A | 2/1983 | Bignell |
| 4,377,834 A | 3/1983 | Eriksson |
| 4,438,475 A | 3/1984 | Haley |
| 4,475,079 A | 10/1984 | Gale |
| 4,499,417 A | 2/1985 | Wright |
| 4,500,834 A | 2/1985 | Ko |
| 4,618,933 A | 10/1986 | Vitins |
| 4,626,772 A | 12/1986 | Michel |
| 4,766,549 A | 8/1988 | Schweitzer |
| 4,797,805 A | 1/1989 | Nimmersjö |
| 4,800,509 A | 1/1989 | Nimmersjö |
| 4,825,326 A | 4/1989 | Andow |
| 5,083,086 A | 1/1992 | Steiner |
| 5,140,492 A | 8/1992 | Schweitzer, III |
| 5,198,746 A | 3/1993 | Gyugyi |
| 5,367,426 A | 11/1994 | Schweitzer, III |
| 5,446,387 A | 8/1995 | Eriksson |
| 5,481,195 A | 1/1996 | Meyer |
| 5,515,227 A | 5/1996 | Roberts |
| 5,572,138 A | 11/1996 | Nimmersjö |
| 5,682,100 A | 10/1997 | Rossi |
| 5,729,144 A | 3/1998 | Cummins |
| 5,796,258 A | 8/1998 | Yang |
| 6,222,711 B1 | 4/2001 | Hori |
| 6,239,959 B1 | 5/2001 | Alexander |
| 6,341,055 B1 | 1/2002 | Guzman-Casillas |
| 6,417,791 B1 | 7/2002 | Benmouyal |
| 6,434,715 B1 | 8/2002 | Andersen |
| 6,477,475 B1 | 11/2002 | Takaoka |
| 6,525,543 B1 | 2/2003 | Roberts |
| 6,597,180 B1 | 7/2003 | Takaoka |
| 6,601,001 B1 | 7/2003 | Moore |
| 6,662,124 B2 | 12/2003 | Schweitzer, III |
| 6,798,211 B1 | 9/2004 | Rockwell |
| 6,845,333 B2 | 1/2005 | Anderson |
| 6,944,554 B2 | 9/2005 | Kim |
| 7,119,546 B2 | 10/2006 | Cautereels |
| 7,174,261 B2 | 2/2007 | Gunn |
| 7,345,862 B2 | 3/2008 | Schweitzer, III |
| 7,535,233 B2 | 5/2009 | Kojovic |
| 7,714,735 B2 | 5/2010 | Rockwell |
| 7,733,094 B2 | 6/2010 | Bright |
| 8,315,827 B2 | 11/2012 | Faybisovich |
| 8,410,785 B2 | 4/2013 | Calero |
| 8,502,542 B2 | 8/2013 | Couture |
| 8,525,522 B2 | 9/2013 | Gong |
| 8,598,887 B2 | 12/2013 | Bjorklund |
| 8,655,609 B2 | 2/2014 | Schweitzer |
| 8,675,327 B2 | 3/2014 | Kasztenny |
| 8,781,766 B2 | 7/2014 | Schweitzer |
| 8,990,036 B1 | 3/2015 | Schweitzer |
| 9,257,827 B2 | 2/2016 | Calero |
| 9,316,671 B2 | 4/2016 | Johannesson |
| 9,470,748 B2 | 10/2016 | Schweitzer |
| 9,594,112 B2 | 3/2017 | Schweitzer |
| 9,627,881 B2 | 4/2017 | Schweitzer |
| 9,755,673 B2 | 9/2017 | Hellmann |
| 9,941,684 B2 | 4/2018 | Calero |
| 10,090,664 B2 | 10/2018 | Schweitzer |
| 10,310,004 B2 | 6/2019 | Schweitzer |
| 10,310,005 B2 | 6/2019 | Schweitzer |
| 2001/0012984 A1 | 8/2001 | Adamiak |
| 2002/0165462 A1 | 11/2002 | Westbrook |
| 2003/0099070 A1 | 5/2003 | Macbeth |
| 2004/0189317 A1 | 9/2004 | Borchert |
| 2004/0230367 A1* | 11/2004 | Miller ............... G01M 15/11 701/111 |
| 2004/0230387 A1 | 11/2004 | Bechhoefer |
| 2005/0151659 A1 | 7/2005 | Donovan |
| 2006/0012374 A1 | 1/2006 | Kojovic |
| 2006/0198065 A1 | 9/2006 | Guzman-Casillas |
| 2006/0239602 A1* | 10/2006 | Li ...................... G02B 6/4298 385/11 |
| 2007/0041137 A1 | 2/2007 | Thompson |
| 2007/0086134 A1 | 4/2007 | Zweigle |
| 2007/0103006 A1 | 5/2007 | Zushi |
| 2008/0077336 A1 | 3/2008 | Fernandes |
| 2008/0143344 A1 | 6/2008 | Focia |
| 2008/0239602 A1 | 10/2008 | Kasztenny |
| 2009/0230974 A1 | 9/2009 | Kojovic |
| 2009/0231769 A1 | 9/2009 | Fischer |
| 2010/0002348 A1 | 1/2010 | Donolo |
| 2011/0058285 A1 | 3/2011 | Wibben |
| 2011/0063761 A1 | 3/2011 | Kasztenny |
| 2011/0068803 A1 | 3/2011 | Calero |
| 2011/0173496 A1 | 7/2011 | Hosek |
| 2011/0264388 A1 | 10/2011 | Gong |
| 2012/0086459 A1* | 4/2012 | Kim ...................... G01R 29/18 324/522 |
| 2012/0182657 A1 | 7/2012 | Narendra |
| 2013/0021039 A1 | 1/2013 | Bjorklund |
| 2013/0096854 A1 | 4/2013 | Schweitzer |
| 2013/0100564 A1 | 4/2013 | Zhang |
| 2013/0241622 A1 | 9/2013 | Zerbe |
| 2014/0074414 A1 | 3/2014 | Schweitzer, III |
| 2014/0236502 A1 | 8/2014 | Calero |
| 2015/0233976 A1 | 8/2015 | Johannesson |
| 2015/0255978 A1 | 9/2015 | Chen |
| 2016/0077149 A1 | 3/2016 | Schweitzer |
| 2016/0077150 A1* | 3/2016 | Schweitzer, III .. G01R 31/2836 307/125 |
| 2016/0084893 A1 | 3/2016 | Schweitzer |
| 2016/0187406 A1 | 6/2016 | Liu |
| 2016/0266192 A1 | 9/2016 | Burek |
| 2017/0012424 A1 | 1/2017 | Schweitzer |
| 2017/0082675 A1 | 3/2017 | Schweizer |
| 2017/0117071 A1 | 4/2017 | Johannesson |
| 2017/0146613 A1 | 5/2017 | Schweitzer |
| 2017/0307676 A1* | 10/2017 | Gaouda ................. G01R 31/50 |
| 2017/0356965 A1 | 12/2017 | Guzman-Casillas |
| 2018/0034265 A1 | 2/2018 | Naidu |
| 2018/0083437 A1 | 3/2018 | Schweitzer, III |
| 2018/0106849 A1 | 4/2018 | Burek |
| 2018/0136269 A1 | 5/2018 | Schweitzer, III |
| 2018/0145505 A1 | 5/2018 | Li |
| 2018/0212421 A1 | 7/2018 | Schweitzer, III |
| 2018/0292448 A1 | 10/2018 | Schweitzer |
| 2018/0301894 A1 | 10/2018 | Ha |

FOREIGN PATENT DOCUMENTS

| | | |
|---|---|---|
| EP | 164711 | 12/1991 |
| EP | 244649 | 4/1992 |
| EP | 627085 | 12/2005 |
| GB | 1463755 | 2/1977 |
| WO | 9519060 | 7/1995 |
| WO | 2007135073 | 11/2007 |
| WO | 2010099585 | 9/2010 |
| WO | 2013119315 | 8/2013 |

OTHER PUBLICATIONS

Masaoki Ando, Edmund O. Schweitzer III, R. A. Baker, Development and Field-Data Evaluation of Single-End Fault Locator for Two-Terminal HVDC Transmission Lines, IEEE Transactions on Power Apparatus and Systems, vol. PAS-104, No. 12, 1985.

Masaoki Ando, Fault Location Techniques for HVDC Lines: Analysis, Development, Simulation, and Field-Data Evaluation, 1984.

P.F. Gale, Overhead Line Fault Location Based on Travelling Waves & GPS, 1993.

Harry Lee, Development of an Accurate Transmission Line Fault Locator Using the Glabal Positioning System and Satellites, 1994.

Hewlett Packard, Traveling Wave Fault Location in Power Transmission Systems, Application Note 1285, 1997.

(56) References Cited

OTHER PUBLICATIONS

Michael A. Street, Delivery and Application of Precise Timing for a Traveling Wave Powerline Fault Locator System, 1990.

Sergio Luiz Zimath, Marco Antonio Ramos, Jayme Silva Filho, Joaquim Moutinho Beck, Nei Mueller, Traveling Wave-Based Fault Location Experiences, 2010.

Qualitrol Corporation, Telefault TWS Traveling Wave Fault Locator, Qualitrol Brochure 2004.

Gabriel Benmouyal, Jeff Roberts, Superimposed Quantities: Their True Nature and Application in Relays, Oct. 1999.

Elhaffar, Power Transmission Line Fault Location Based on Current Traveling Waves. TKK Dissertations 107, Espoo 2008, Helsinki University of Technology. Department of Electrical Engineering, Dec. 2008.

Reason International, Inc., Traveling Wave Fault Location in Power Transmission Systems, White Paper.

Carlos Alberto Dutra, Rafael Rosar Matos, Sergio Luiz Zimath, Jurandir Paz De Oliveira, Joao Henrique Monteiro De Resende, Joaquim Americo Pinto Moutinho, Fault Location by Traveling Waves: Application in High Impedance Events.

N. Fischer, V. Skendzic, R. Moxley, J. Needs, Protective Relay Traveling Wave Fault Location, Feb. 9, 2012.

E. O. Schweitzer, III, Jeff Roberts, Distance Relay Element Design, Apr. 1993.

Fernando Calero, Distance Elements: Linking Theory with Testing, Oct. 21, 2008.

Armando Guzman, Joe Mooney, Gabriel Benmouyal, Normann Fischer, Transmission Line Protection System for Increasing Power System Requirements Apr. 8, 2002.

Borghetti, et al, "On the use of continuous-wavelet transform for fault location in distribution power systems." International Journal of Electrical Power & Energy Systems. Nov. 2006.

Maher M.I. Hashim, Hew Wooi Ping, V.K. Ramachandaramurthy, Impedance-Based Fault Location Techniques for Transmission Lines, Sep. 2009.

Zheng et al., Study on Impedance-Traveling Wave Assembled Algorithm in One-Terminal Fault Location System for Transmission Lines, Apr. 2008.

Gabriel Benmouyal, Karl Zimmerman, Experience With Subcycle Operating Time Distance Elements in Transmission Line Digital Relays, Presented at the 37th Annual Western Protective Relay Conference Oct. 2010.

Edmund O. Schweitzer, III, Armando Guzman-Casillas, Mangapathirao Venkat Mynam, Veselin Skendzic, Bogdan Kasztenny, Stephen Marx, Locating Faults by the Traveling Waves They Launch, Feb. 10, 2014.

Toshio Tahagi, Jun-Ichi Baba, Katauhiko Usmura, Tishiaki Sakaguchi, Fault Protection Based on Travelling Wave Theory—Part I Theory, Jan. 24, 1977.

Schweitzer III, Edmund O.; Kasztenny, Bogdan "Distance Protection: Why Have We Started With a Circle, Does It Matter, and What Else Is Out There?" IEEE 2018. Originally presented at the 44th Annual Western Protective Relay Conference, Oct. 2017.

He, Baina, Yunwei Zhao, and Hengxu Ha. "A Novel Wave Based Differential Protection for Distributed Parameter Line." TELKOMNIKA Indonesian Journal of Electrical Engineering TELKOMNIKA 11.9 (2013): 5097-104.

Tang, Lanxi; Dong, Xinzhou; Shi, Shenxing; Wang, Bin; "Travelling Wave Differential Protection Based on Equivalent Travelling Wave", 13th IET International Conference on Developments in Power System Protection (DPSP 2016), Mar. 7-10, 2016.

Solveig Ward, Comparison of Quadrilateral and Mho Distance Characteristic, Oct. 26, 1999.

Jeff Roberts, Edmund O. Schweitzer, III, Renu Aurora, Ernie Poggi, Limits to the Sensitivity of Ground Directional and Distance Protection, May 15, 1997.

Fernando Calero, Armando Guzman, Gabriel Benmouyal, Adaptive Phase and Ground Quadrilateral Distance Elements, Dec. 14, 2009.

James Hubertus, Joe Mooney, George Alexander, Application Considerations for Distance Relays on Impedance-Grounded Systems, Sep. 12, 2007.

Joe Mooney, P.E., Jackie Peer, Application Guidelines for Ground Fault Protection, 1997.

PCT/US2019/033694 Patent Cooperation Treaty, International Search Report and Written Opinion of the International Searching Authority, dated Aug. 2, 2019.

\* cited by examiner

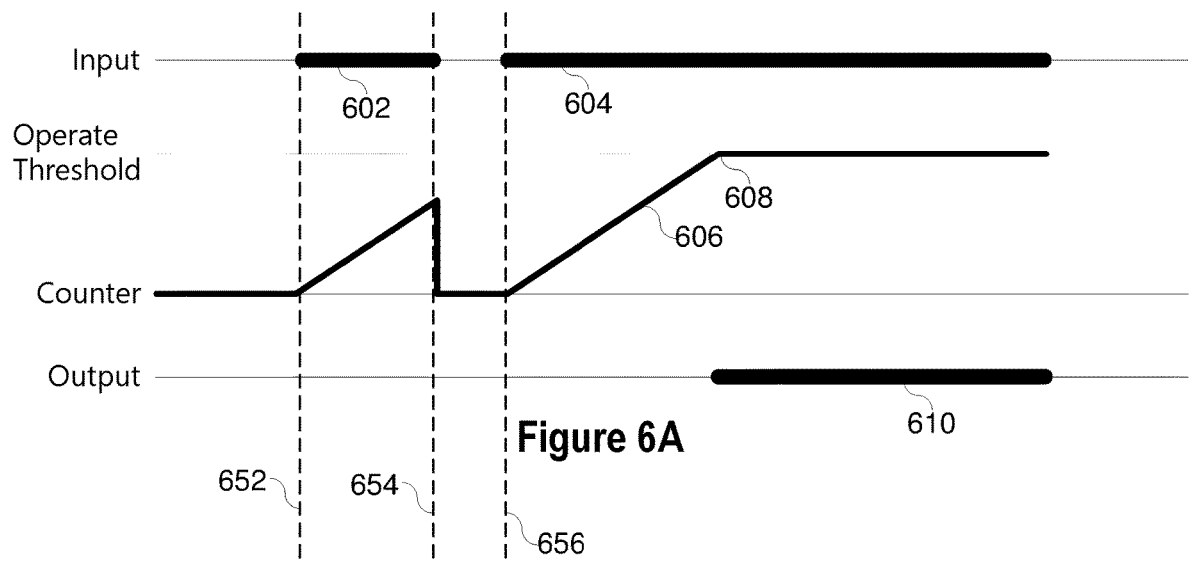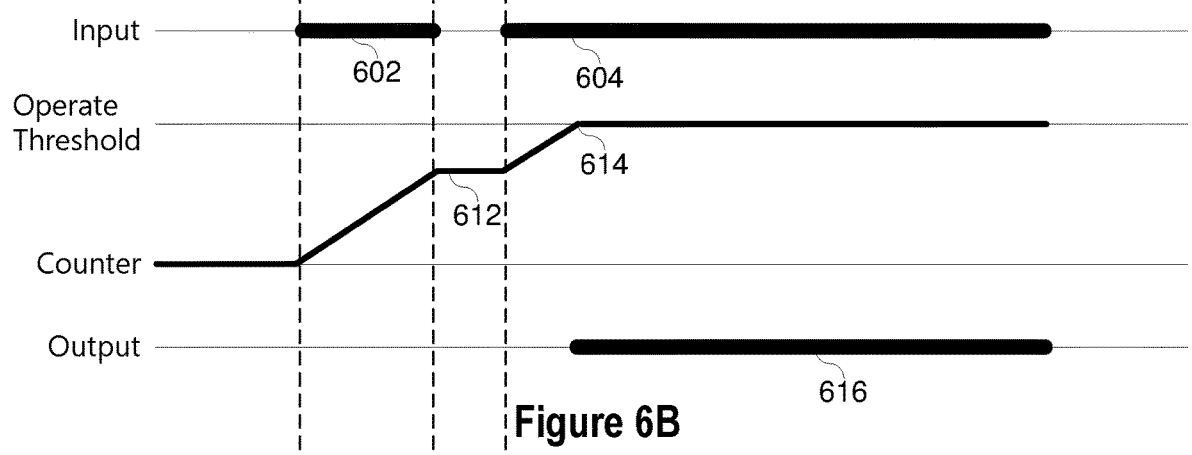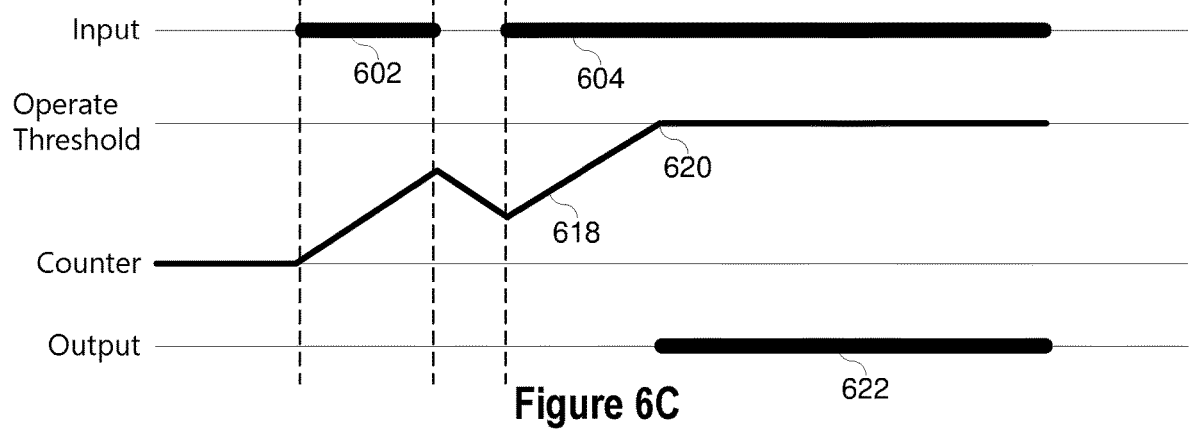

DISTANCE PROTECTION OF ELECTRIC POWER DELIVERY SYSTEMS USING TIME DOMAIN AND FREQUENCY DOMAIN

RELATED APPLICATION (none)

TECHNICAL FIELD

This disclosure relates to distance protection of electric power delivery systems using time domain and frequency domain. More particularly, this disclosure relates to determining if a fault is located within a distance zone of protection or not using time-domain principles secured using frequency-domain principles. This disclosure also relates to improving speed and security of protection using both time-domain and frequency-domain principles.

BRIEF DESCRIPTION OF THE DRAWINGS

Non-limiting and non-exhaustive embodiments of the disclosure are described, including various embodiments of the disclosure with reference to the figures, in which:

FIGS. 6A, 6B, and 6C illustrate timing diagrams for integrating timers that may be used in the time-domain fault detection in accordance with several embodiments herein.

DETAILED DESCRIPTION

Figure 1:
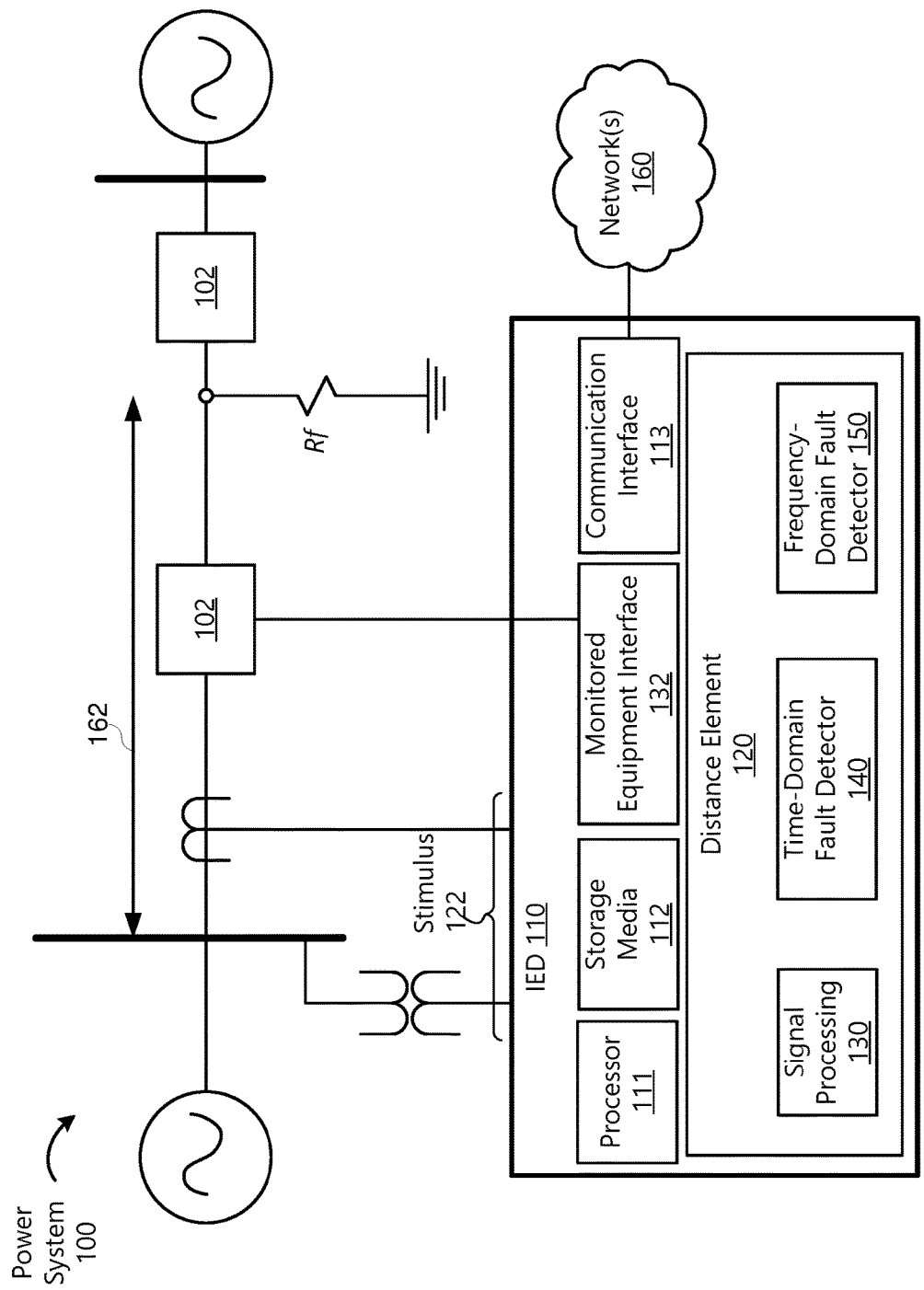
FIG. 1 illustrates a one-line diagram of an electrical power delivery system comprising an Intelligent Electronic Device (IED) implementing distance protection in accordance with several embodiments herein.

Electric power delivery systems are widely in facilitation of generation, transmission, distribution, and consumption of electric power. Such systems include a wide variety of equipment specifically designed for the purposes of electric power delivery. Such equipment is, at times, subject to conditions outside of the specified operating parameters thereof, which may result in damage to the equipment, interruption in the generation, delivery, or consumption of electric power, or similar damages. In order to mitigate against or even avoid such conditions, electric power delivery equipment and systems of equipment are often monitored using IEDs that gather information from the equipment, determine operating conditions, and take an action if the determined operating conditions are outside of acceptable parameters.

For example, a three-phase electric power transmission line of an electric power delivery system may be used to carry electric power on separate conductors over long distances at a high voltage. The conductors are insulated from each other and the ground. A failure of the insulation may occur for multiple reasons resulting in one conductor coming into electrical contact with another conductor or the ground. Such a failure is commonly referred as a fault. Such fault conditions may, if permitted to persist, cause further damage to the transmission line, and its surroundings, including property damage and human and animal life. An IED may be used to monitor such transmission line by obtaining electrical information from the transmission line such as, for example, voltages and currents of the transmission line. The IED may obtain the electrical information from one end of the transmission line, and may operate to detect fault conditions over a predetermined zone of the transmission line. If a fault condition is detected within the zone of protection on the transmission line, the IED may command a circuit breaker to open, removing electric power from the transmission line. Accordingly, the IED must detect the fault, the direction to the fault, and ensure that the fault is within a distance or zone of protection using the electrical information obtained and pre-determined line parameters before commanding the circuit breaker to open. Such monitoring in an IED by determining whether a fault is within a distance or zone of protection and commanding a circuit breaker to open may be performed using a protection element termed a "distance element".

In general, a distance element may include several logical conditions (comparators) joined with an AND gate. For example, a quadrilateral distance element includes the reactance comparator, the right blinder comparator, the left blinder comparator (optionally), the directional comparator, and the phase selection comparator. A mho distance element includes the mho comparator, the phase selection comparator, and the directional comparator. The mho element can be further modified by optionally adding the reactance comparator or the blinder comparator. Performance of all individual comparators that make up a distance element is important for the performance of the element. Further, the speed and security of a distance element is especially affected by reach-sensitive comparators, which are responsible for distinguishing between faults located short of the distance element's reach point from faults located beyond the reach point. These may be embodied as the mho comparator in the mho element, and the reactance comparator in the quadrilateral element. To some degree it may also be embodied in the blinder comparator (resistive reach comparator).

Such IEDs may determine a fault condition and conclude that the fault is within the zone of protection (is between the IED and the distance element's reach point on the transmission line) using an operating signal $S_{OP}$ and a polarizing signal $S_{POL}$, which may be calculated using the measured voltage and current along with the line impedance as illustrated in Equations 1 and 2:

$$S_{OP} = I^* Z_R - V \qquad \text{Eq. 1}$$

$$S_{POL} = V_{POL} \qquad \text{Eq. 2}$$

where:
I is the measured current;
V is the measured voltage;
$Z_R$ is the impedance between the location where I and V are measured and the intended reach point; and
$V_{POL}$ is a polarizing signal which may be selected from values such as: the measured voltage (a self-polarized mho); healthy phase voltage (a cross-phase polarized mho); positive-sequence voltage (a positive-sequence polarized mho); or, memorized voltage (memory polarized mho).

The voltage V and current I may be selected based on the fault type from the three-phase quantities ($V_A$, $V_B$, $V_C$, $I_A$, $I_B$, $I_C$). The fault type may be determined from among phase-to-ground loops (AG, BG, CG) and phase-to-phase loops (AB, BC, CA). Phase selection logic may be used to determine the fault type for the phase quantities to be used by the distance element. For example, the phase selection logic may permit the AG loops to operate during phase A to ground faults; and may permit the AB loop to operate during phase A to phase B faults and phase A to phase B to ground faults.

In steady states, the operating and polarizing signals of the distance comparator are sinewaves. A comparator asserts its output if the $S_{OP}$ and $S_{POL}$ are approximately in-phase, and it keeps the output deasserted if the $S_{OP}$ and $S_{POL}$ signals are approximately out-of-phase. Typically, the operating threshold is drawn at 90 degrees: if the angle between the $S_{OP}$ and $S_{POL}$ is less than 90 degrees in either direction, then the comparator asserts; and, if the angle is greater than 90 degrees, the comparator stays deasserted.

The operating and polarizing signals may be determined using time-domain principles or frequency-domain principles. Under time-domain principles, the operating signal $s_{OP}$ may be determined using Equation 3:

$$s_{OP} = v - \Delta v_{REACH} \qquad \text{Eq. 3}$$

where:
$s_{OP}$ is the operating signal using time-domain principles (note that the lower-case generally refers to instantaneous values, where capitalized terms generally refer to phasor values, where appropriate);
v is the instantaneous voltage; and
$\Delta v_{REACH}$ is the instantaneous voltage drop across the reach impedance, which, according to several embodiments, may be calculated using $R^*i + L^* di/dt$, where R and L refer to the line resistance and inductance, respectively.

The operating and polarizing signals may be determined using frequency-domain principles using complex math to convert the current phasor I into the voltage drop across the reach impedance, subtracting this from the voltage phasor, and obtaining the phasor operating signal $S_{OP}$. Alternatively, the instantaneous operating signal (using time-domain principles) may be passed through a phasor estimator to provide the frequency-domain $S_{OP}$ signal directly.

In yet other implementations, a reactance comparator may use the operating signal $S_{OP}$ according to Equation 1 and the polarizing signal calculated according to Equation 4:

$$S_{POL} = j^* I_{POL} \qquad \text{Eq. 4}$$

where:
j denotes a phase shift by 90 degrees in frequency domain, or the di/dt operation on the polarizing current ($I_{POL}$) in time domain.

Similar to the above notation on polarization, the polarizing current $I_{POL}$ may be selected as the loop current (a self-polarized reactance), or the negative-sequence current (a negative-sequence polarized reactance) or the zero-sequence current (a zero-sequence polarized reactance), or the like.

As mentioned above, a fault within the zone of protection is detected using the operating and polarizing signals implemented in various protective devices. For example, an electromechanical device may use electromechanical components to compare the operating and polarizing signals, and send a trip signal to a circuit breaker when appropriate. In other embodiments, microprocessor-based IEDs may be used to calculate phasors, and follow one or more of various approaches to determine a fault condition, including, for example: a) calculate the angle between the operating and polarizing signals directly and check it against the 90 deg threshold, b) calculate the torque $Re(S_{OP} \cdot conj(S_{POL}))$ and check if it is positive $Re(S_{OP} \cdot conj(S_{POL})) > 0$, or c) calculate the m-value (where m is the per-unit distance to the fault) and check if it is lower than the per-unit reach setting. The various approaches differ in terms of operations required to complete and their computational burden. For example, the m-value method is computationally very efficient when implementing multiple zones with identical settings except the reach settings.

When using time domain, timers may be used to check how long the operating and polarizing signals $s_{OP}$ and $s_{POL}$ are of the same polarity. After low pass filtering the $s_{OP}$ and $s_{POL}$ signals are sinewaves. If they are perfectly in phase, they coincide (have the same polarity) for half a cycle in each half a cycle. If they are 90 degrees apart, they coincide for quarter of a cycle in each half cycle. If they are perfectly out of phase, they do not coincide at all. A rectifier may be used to detect instantaneous polarity (sign) of the $s_{OP}$ and $s_{POL}$ signals. Simple logic including AND and OR gates may be used to detect if the $s_{OP}$ and $s_{POL}$ signals are of the same polarity, and a timer may be used to check if the same-polarity situation lasted for longer than quarter of a cycle. If so, the time-domain distance comparator asserts.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described may be implemented as software modules or components or elements. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory computer and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of machine-readable media suitable for storing electronic and/or processor executable instructions.

FIG. 1 illustrates a one-line diagram of an electric power delivery system 100 monitored by an IED 110 that provides distance protection in accordance with several embodiments herein. As discussed above, the IED 110 may comprise and/or be implemented in conjunction with a computing device. Accordingly, the IED 110 may include a processor 111, which may comprise one or more general purpose processors, special purposes processors, application-specific integrated circuits, programmable logic elements (e.g., FPGAs), or the like. The IED 110 may further comprise non-transitory machine-readable storage media 112, which may include one or more disks, solid-state storage (e.g., Flash memory), optical media, or the like. The IED 110 may be communicatively coupled to one or more networks 160 via one or more communication interfaces 113. The networks 160 may include special-purpose networks for monitoring and/or controlling the electrical power system 100 (e.g., SCADA networks, or the like). The networks 160 may further include general purpose communication networks, such as a TCP/IP network, or the like. The communication interface 113 may include wired and/or wireless communication interfaces (e.g., serial ports, RJ-45, IEEE 802.11 wireless network transceivers, etc.). In some embodiments, the IED 110 may include human-machine interface (HMI) components (not shown), such as a display, input devices, and so on.

The IED 110 may include a plurality of protection elements such as a distance element 120 that may be embodied as instructions stored on computer-readable media (such as storage media 112) that, when executed on the processor 111, cause the IED to detect a fault within a zone of protection. The distance element may include instructions for signal processing 130, time-domain fault detector 140, and a frequency-domain fault detector 150. Upon detection of a fault within the zone of protection 162 using the time-domain fault detector 140 and the frequency-domain fault detector 150, the distance element 120 may include instructions to cause the IED to signal a circuit breaker 102 to open, removing electric power from being fed to the fault.

The IED 110 may be communicatively coupled to the power system 100 through current transformers and voltage transformers, i.e. it may receive stimulus 122 from the power system 100. The stimulus 122 may be received directly via the measurement devices described above and/or indirectly via the communication interface 113 (e.g., from another IED or other monitoring device (not shown) in the electrical power system 100). The stimulus 122 may include, but is not limited to: current measurements, voltage measurements, and the like.

Furthermore, the IED 110 may include a monitored equipment interface 132 in electrical communication with a piece of monitored equipment. As illustrated, the monitored equipment interface 132 is in communication with a circuit breaker 102. The monitored equipment interface 132 may include hardware for providing a signal to the circuit breaker 102 to open and/or close in response to a command from the IED 110. For example, upon detection of a fault within the zone of protection, the distance element 120 may signal the monitored equipment interface 132 to provide an open signal to the circuit breaker 102, thus effecting a protective action on the electric power delivery system. In certain embodiments, the protective action may be effected by additional or separate devices. For example, upon detection of the fault, the distance element 120 may signal the communication interface 113, which signals other devices (using, for example, the network 160, or signaling another device directly) regarding the fault, which other devices may signal a breaker to open, this effecting the protective action on the electric power delivery system.

The signals obtained from the electric power delivery system may be used to calculate voltage and current signals for use by the distance element. Line currents and voltages may be sampled at a rate suitable for distance protection, such as in the order of kHz. The samples may be aligned with a time input (not shown) in some embodiments. An analog-to-digital converter (ADC) 204 may create digital representations of the incoming line current and voltage measurements. The output of the ADC may be used in various algorithms. As described above, these voltage and current signals may be used to calculate the operating and polarizing quantities as described herein.

Figure 2:
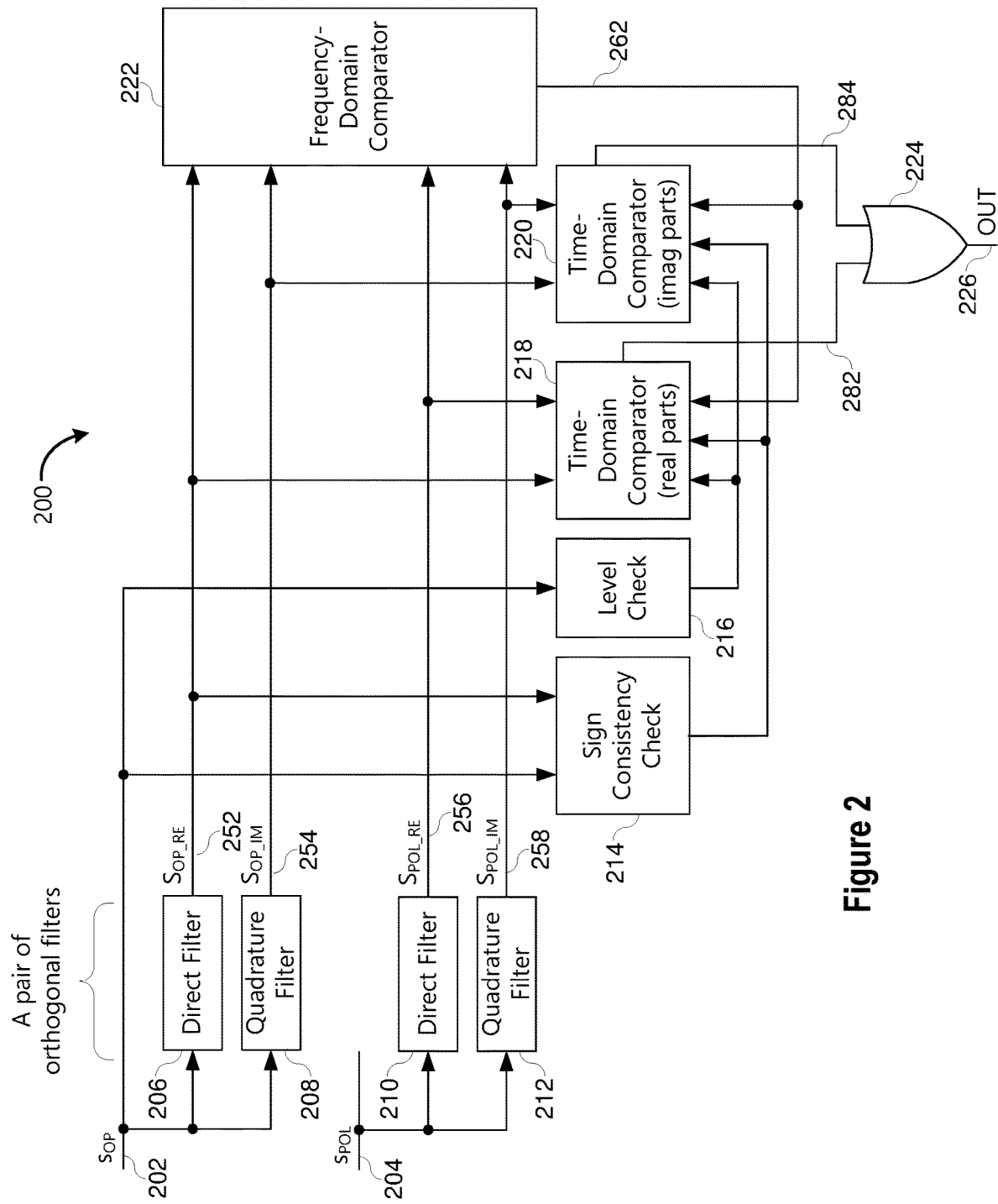
FIG. 2 illustrates a simplified block diagram of a comparator within a distance element using time-domain and frequency-domain principles in accordance with several embodiments herein.

FIG. 2 illustrates a simplified block diagram of a distance element using both time-domain and frequency-domain principles according to several embodiments herein. Generally, the time-domain comparators are supervised using frequency-domain principles. According to several embodiments of the present disclosure, a pair of filters may be used to derive both the time-domain and frequency-domain measurements. The direct filter(s) can be a cosine filter for example, and the matching quadrature filter(s) can be a sine filter. Although separate and specific filters are illustrated, any pair of orthogonal filters may be used. According to several embodiments herein, the filters may be compensated for group delay so that, in steady state, the output from the direct filter(s) is aligned with the input signal. In general, the output of the direct filter may be referred to as a real part, and the output from the quadrature filter may be the imaginary part.

The distance element 200 illustrated starts with the time-domain operating signal $s_{OP}$ 202 and time-domain polarizing signal $s_{POL}$ 204. The time-domain operating and polarizing signals $s_{OP}$ 202, $s_{POL}$ 204 may be calculated according to several embodiments described herein. Orthogonal filters may be used to calculate real and imaginary parts (frequency-domain) from the time-domain operating and polarizing signals $s_{OP}$ 202, $s_{POL}$ 204. That is, the time-domain operating signal $s_{OP}$ 202 may be filtered by a direct filter 206 to produce the real part of the frequency-domain operating signal $S_{OP\_RE}$ 252, and the time-domain operating signal $s_{OP}$ 202 may be filtered by a quadrature filter 208 to produce the imaginary part of the frequency-domain operating signal $S_{OP\_IM}$ 254. Similarly, the time-domain polarizing signal $s_{POL}$ 204 may be filtered by a direct filter 210 to produce the real part of the frequency-domain polarizing signal $S_{POL\_RE}$ 256, and the time-domain polarizing signal $S_{POL}$ 204 may be filtered by a quadrature filter 212 to produce the imaginary part of the frequency-domain polarizing signal $S_{POL\_IM}$ 258.

A time-domain comparator for the real parts 218 may receive the real parts of the operating and polarizing signals $S_{OP\_RE}$ 252 and $S_{POL\_RE}$ 256 to determine whether the real parts of the operating and polarizing signals $S_{OP\_RE}$ 252 and $S_{POL\_RE}$ 256 are of the same polarity. Comparator 218 asserts signal 282 when the real parts of the operating and polarizing signals are of the same polarity for the predetermined time. Similarly, a time-domain comparator for the imaginary parts 220 may receive the imaginary parts of the operating and polarizing signals $S_{OP\_IM}$ 254 and $S_{POL\_IM}$ 258 to determine whether the imaginary parts of the operating and polarizing signals $S_{OP\_IM}$ 254 and $S_{POL\_IM}$ 258 are of the same polarity. Comparator 220 asserts signal 284 when the imaginary parts of the operating and polarizing signals are of the same polarity for the predetermined time.

The time-domain comparators 218, 220 may be supervised by a sign consistency check 214, a level check 216, and the frequency-domain comparator 222. Specifically, the frequency-domain comparator 222 may receive the real and imaginary parts of the frequency-domain operating and polarizing signals $S_{OP\_RE}$ 252, $S_{OP\_IM}$ 254, $S_{POL\_RE}$ 256, and $S_{POL\_IM}$ 258 and output a frequency-domain fault detection signal 262 indicating that the operating $S_{OP}$ and polarizing $S_{POL}$ signals are in phase.

Figure 3A:
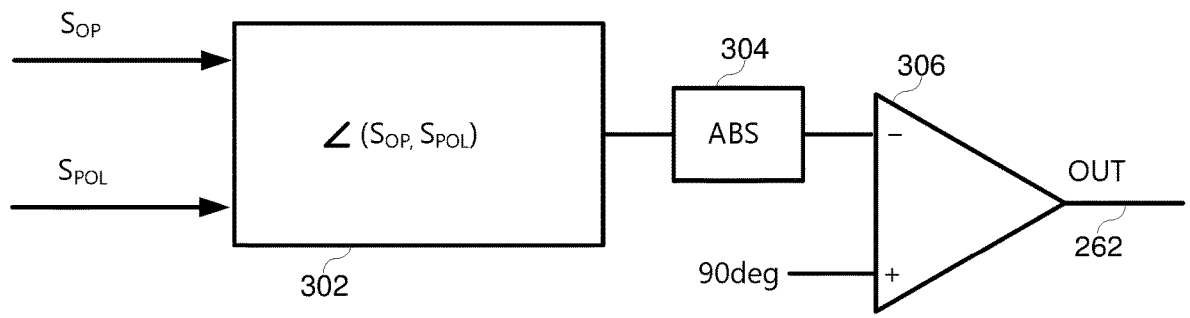
FIGS. 3A, 3B, and 3C illustrate simplified block diagrams of logic for frequency-domain distance comparator according to several embodiments herein.
Figure 3B:
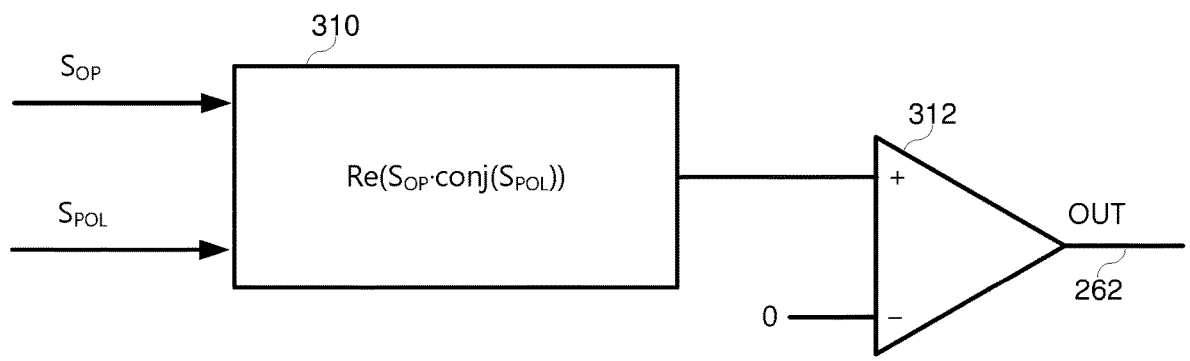
Figure 3C:
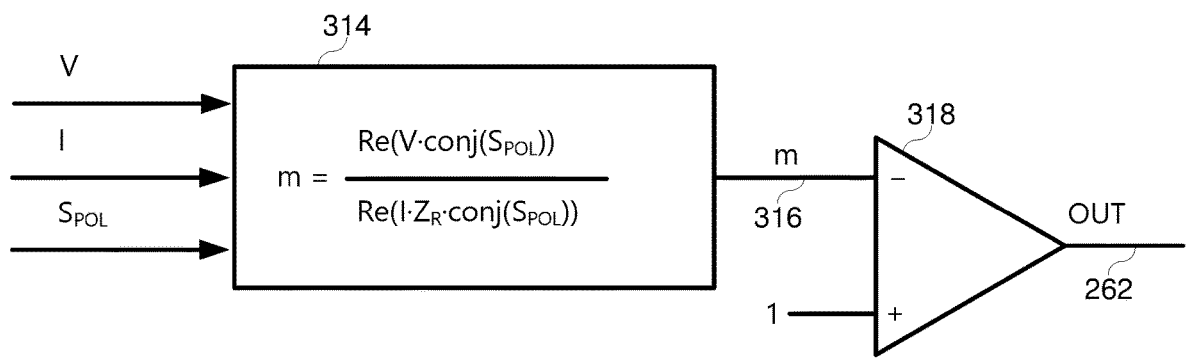

FIGS. 3A, 3B, and 3C illustrate block diagrams of frequency-domain comparators that may be used in accordance with several embodiments herein. Generally, these comparators will output a signal 262 upon determination that the polarizing and operating signals are in phase. The comparator of FIG. 3A uses the operating and polarizing quantities $S_{OP}$, $S_{POL}$ in a direct angle calculator 302 which calculates an angle between the operating and polarizing quantities $S_{OP}$, $S_{POL}$. In some embodiments, the operating and polarizing quantities $S_{OP}$, $S_{POL}$ such as those calculated using Equations 1, 2, and 4 may be used. An absolute value of the angle is determined 304 and compared against a predetermined angle threshold such as, for example, 90 degrees in comparator 306. When the angle is less than the predetermined threshold, then the comparator 306 asserts signal 262 indicating that the polarizing and operating signals are less than 90 deg apart.

The comparator of FIG. 3B uses the operating and polarizing quantities $S_{OP}$, $S_{POL}$ in a torque calculator 310 which operates to determine a real part of the product of the operating quantity $S_{OP}$ and the complex conjugate of the polarizing quantity $S_{POL}$. A comparator 312 asserts if the output of the calculator is greater than zero, indicating that the polarizing and operating signals are less than 90 deg apart.

FIG. 3C illustrates yet another option for the frequency-domain comparator, but this time only applicable to the mho comparator only, using voltage V, current I, reach impedance $Z_R$ as well as the polarizing signal $S_{POL}$. The voltage V and current I signals may be obtained as described above from the power system. The polarizing quantity may be any of the polarizing quantities as described above. A per-unit fault location quantity m is calculated using calculator 314 using, for example, Equation 5:

$$m = \frac{\text{Re}(V * conj(S_{POL}))}{\text{Re}(I * Z_R = conj(S_{POL}))} \qquad \text{Eq. 5}$$

As noted, the m value denotes a per-unit fault location. An m-value of unity would result from a fault at the reach point. Accordingly, if the m-value according to Equation 5 is less than unity, in comparator 318, then it is determined that the fault is within the mho comparator zone of protection, and signal 262 is asserted.

The frequency-domain comparator 222 (as may be embodied using any of the comparators of FIGS. 3A, 3B, 3C, or others) can be run at any arbitrary processing rate, including very slow rates. The frequency-domain comparator may be executed as slow as four times per power system cycle. Presently, the frequency-domain comparator is executed at higher rates. The output of the frequency-domain comparator 262 remains asserted as long as the conditions are satisfied (such as, for example, the angles of calculator 302 are greater than 90 degrees apart), even as those signals constantly change following the sinewave shape.

To improve the frequency-domain comparators used in accordance with the several embodiments herein, the input voltage and current signals may be filtered. Furthermore, a short output timer may be used on the output (such as, for example, signal 262) to improve security.

In several embodiments herein, the frequency-domain principles may be used to supervise the time-domain comparators. Due to this supervisory function, the frequency-domain comparators do not require accurate phasors. Instead, to increase the speed of the frequency-domain comparators, real and imaginary parts on a shortened time scale may be calculated by shortening data windows for the orthogonal filters (e.g. filters 206, 208, 210, 212).

Figure 4A:
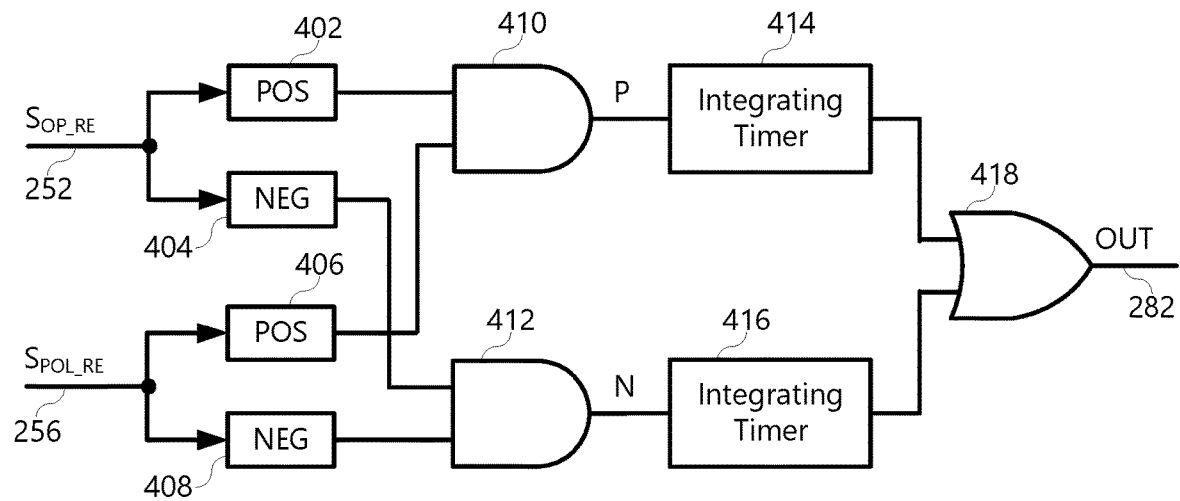
FIGS. 4A and 4B illustrate simplified block diagrams of logic for time-domain distance comparator according to several embodiments herein using real portions of operating and polarizing signals.
Figure 4B:
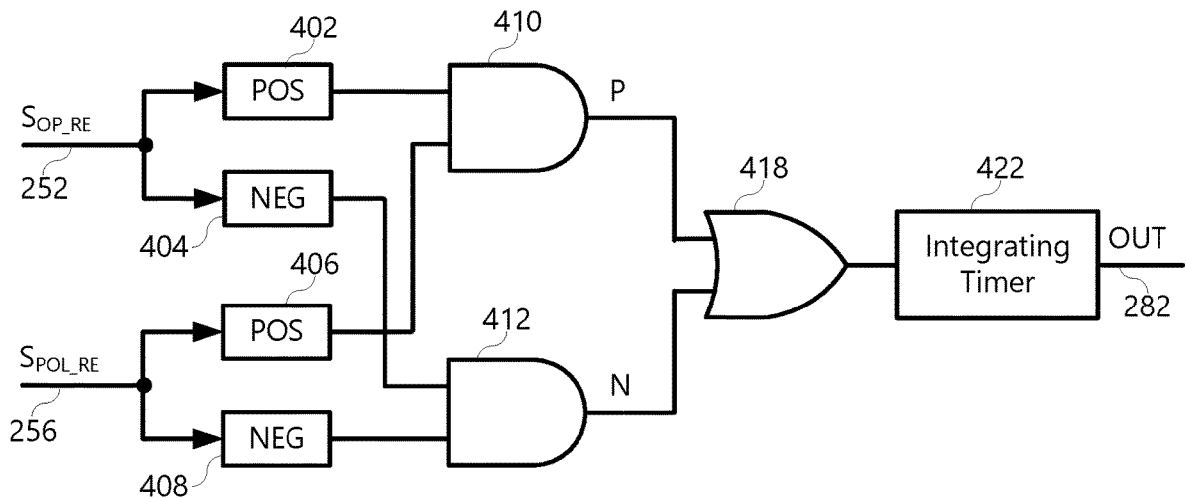

Returning now to the time-domain comparators 218, 220 of FIG. 2, several of the possible embodiments of such are described in the following descriptions. In sum, the time-domain comparators assert when the real parts of the operating and polarizing quantities have the same sign (positive or negative) for a predetermined time (a coincidence time); or, the imaginary parts of the operating and polarizing quantities are both positive or negative for a predetermined time. FIGS. 4A and 4B illustrate simplified logic diagrams of time-domain distance comparators. Specifically, FIG. 4A shows the time-domain comparator 218 and it uses the real parts of the operating and polarizing signals $S_{OP\_RE}$ 252, $S_{POL\_RE}$ 256. As the operating and polarizing signals are generally in the form alternating current waves, they will periodically shift between positive and negative values. The positive blocks 402 and 406 will assert when the real part of the operating and polarizing signals $S_{OP\_RE}$ 252 and $S_{POL\_RE}$ 256, respectively, are positive. Similarly, the negative blocks 404 and 408 will assert when the real parts of the operating and polarizing signals $S_{OP\_RE}$ 252 and $S_{POL\_RE}$ 256, respectively, are negative. When both positive blocks 402, 406 are asserted, AND block 410 asserts P indicating that the real parts of both of the operating and polarizing signals $S_{OP\_RE}$ 252 and $S_{POL\_RE}$ 256 are positive, and integrating timer 414 is started. Similarly, when both negative blocks 404, 408 are asserted, AND block 412 asserts N indicating that the real parts of both the operating and polarizing signals $S_{OP\_RE}$ 252 and $S_{POL\_RE}$ 256 are negative, and integrating timer 416 is started.

The integrating timers 414, 416 may assert an output to OR 418 when the signals P (from AND gate 410) or N (from AND gate 412) are asserted for the predetermined times of the timers. In one embodiment, the integrating timers 414, 416 are set with a predetermined time corresponding to one quarter power system cycle. Accordingly, the matching polarities of the signals must coincide for a time duration longer than the equivalent of 90 degrees (one quarter power system cycle) to assert an input to OR gate 418. Upon asserting of either integrating timer 414, or 416, OR gate 418 asserts the time-domain comparator (real parts) output 282.

FIG. 4B illustrates another possible embodiment of the time-domain comparator 218. According to this illustrated embodiment, AND gates 410 and 412 assert to OR gate 418 directly, which then asserts to a single integrating timer 422. The integrating timer 422 may operate similarly to the integrating timers 414, 416, asserting when either the positive or negative portions coincide in polarity for longer than a predetermined time such as, for example, a time corresponding with a quarter power system cycle.

Figure 5A:
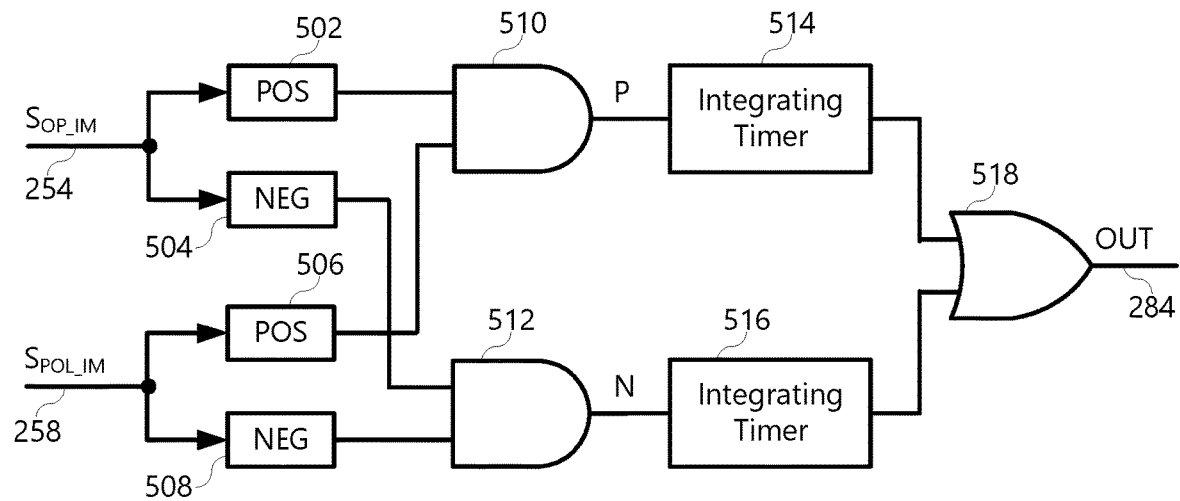
FIGS. 5A and 5B illustrate simplified block diagrams of logic for time-domain distance comparator according to several embodiments herein using imaginary portions of operating and polarizing signals.
Figure 5B:
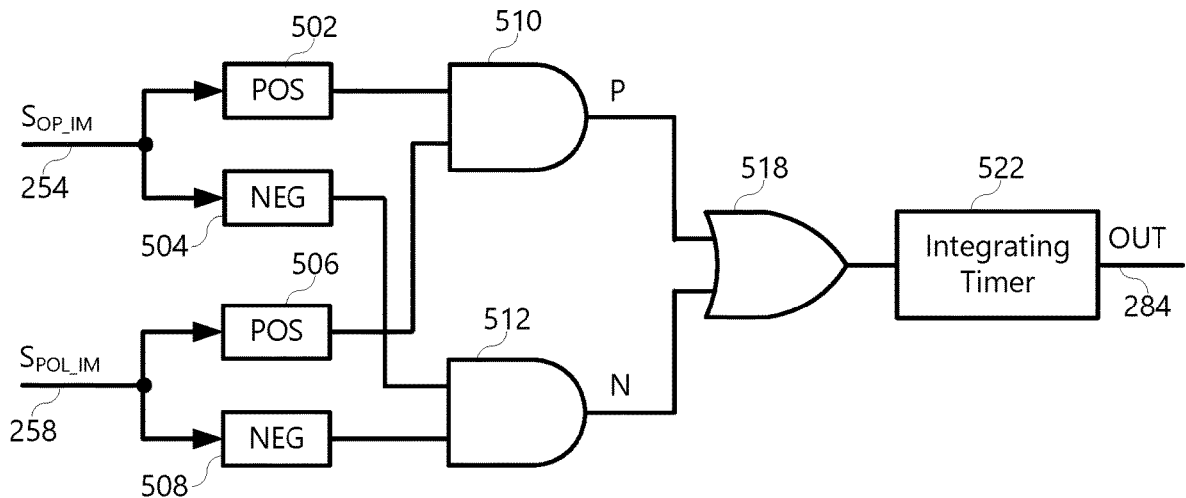

FIGS. 5A and 5B illustrate simplified logic diagrams useful for determining a time-domain comparator output 284 using the imaginary parts of the operating and polarizing signals $S_{OP\_IM}$ 254, $S_{POL\_IM}$ 258. Similar to the embodiments previously illustrated, positive blocks 502, 506 and negative blocks 504, 508 assert when the imaginary parts of the operating and polarizing signals $S_{OP\_IM}$ 254, $S_{POL\_IM}$ 258 are, respectively, positive or negative. AND gate 510 asserts when the imaginary parts of the operating and polarizing signals $S_{OP\_IM}$ 254, $S_{POL\_IM}$ 258 are both positive; and AND gate 512 asserts when the imaginary parts of the operating and polarizing signals $S_{OP\_IM}$ 254, $S_{POL\_IM}$ 258 are both negative. Integrating timers 514 and 516 assert when the positive or negative AND gates 510, 512 assert for the predetermined time (such as, for example, a time associated with a quarter power system cycle). Assertion of either timer 514, 516 will cause OR gate 518 to assert the time-domain comparator signal 284.

Similarly, as illustrated in FIG. 5B, AND gates 510 and 512 assert to OR gate 518 directly, which then asserts to a single integrating timer 522. The integrating timer 522 may operate similarly to the integrating timers 514, 516, asserting when either the positive or negative portions coincide in polarity for longer than a predetermined time such as, for example, a time corresponding with a quarter power system cycle.

For speed, several embodiments herein apply coincidence timing to both the real and imaginary parts of the operating and polarizing signals. Depending on the point on wave, that is, the moment of the fault as it relates to the peaks and zero-crossings of the pre-fault voltage, either the real part of a phasor or the imaginary part of a phasor develops (i.e. tracks a fault condition) faster. Typically, when the real part is slow, the imaginary part is faster; and when the imaginary part is slow, the real part is faster. This relationship may be due to the real part being related to the signal value while the imaginary part being related to the signal derivative. It is observed that a sinewave has a zero value but a maximum derivative when crossing a zero, and has a maximum value but zero derivative when passing a peak.

As illustrated in FIG. 2, the outputs 282, 284 from the real and imaginary parts of the time-domain comparators 218, 220 assert to OR gate 224, which in turn asserts a distance fault determination 226 (which may be termed a distance fault detection signal) when either of the time-domain comparators 218, 220 assert.

Although the time-domain comparators 218, 220 (and as illustrated in FIGS. 4A, 4B, 5A, and 5B) are illustrated as using the real and imaginary parts from the orthogonal filters 206, 208, 210, 212, in various embodiments the real part time-domain comparator 218 may use instantaneous operating and polarizing signals 202, 204, and the imaginary part 220 may be omitted. Furthermore, the real part time-domain comparator 218 may use signals without filtering. Integrating timers (e.g. timers 414, 416, 422) may be used to provide security even if the input signals are heavily distorted due to, for example, lack of filtering.

Integrating timers, (e.g. timers 414, 416, 418, 422, 514, 516, 518, 522) may be implemented according to various timing architectures. In one embodiment, as illustrated in the timing diagram of FIG. 6A, the timer may be implemented to reset instantaneously when the input even momentarily deasserts. As illustrated, the input to the timer initiates at time 652, and remains asserted for the time 602. During the time 602, the counter (of the integrating timer) starts to count. Upon deassertion of the input at time 654, the counter resets to zero, and does not start counting again until reassertion 604 of the input to the timer at time 656. The counter starts counting again the input 606 and, upon reaching the operate threshold, the timer asserts the output 610 starting at time 608.

FIG. 6B illustrates another possible implementation of integrating timer that may be used in accordance with several embodiments herein. This illustrated timer uses a hold logic wherein the counter holds its count until the operate threshold is reached. As illustrated, it can be seen that the counter initiates at time 652 upon assertion of the input to the timer 602. Upon deassertion of the input 602 at time 654, the counter holds for the period that the input is deasserted 612. Upon reassertion of the input at time 656, the counter continues the counting until the operate threshold is reached at time 614, and the output of the timer 616 asserts. In certain embodiments, the time during which the timer retains the count is limited. For example, the timer logic may include a hold time. Upon deassertion of the input signal at time 654, the hold time initiates. If the input signal remains deasserted for longer than the hold time, then the counter resets to zero, similar as illustrated in FIG. 6A.

FIG. 6C illustrates a timing diagram of yet another possible implementation of an integrating timer that may be used in accordance with several embodiments herein. The illustrated timer uses an integrate-down logic upon deassertion of the input. Specifically, upon assertion of the input 602 at time 652, the counter starts counting. Upon deassertion of the input 602 at time 654, the counter begins counting downward. Upon reassertion of the input signal 604 at time 656, the counter again begins to count upward 618 until it reaches the operate threshold at time 620. Upon reaching the operate threshold, the output 622 is asserted at time 620.

In each of the timing diagrams illustrated in FIGS. 6A, 6B, and 6C, the counter may increase at a predetermined rate. Similarly, the rate at which the counter counts downward may be predetermined. In some embodiments, the rate matches the rate at which the counter counts upward during assertion of the input signal 602. In other embodiments, the rates may be different. Moreover, the rates can be dynamic and change based on present conditions, such as, but not limited to, in response to the output of the level check 216 and sign consistency check 214. For example, assertion of the sign consistency check 214 and/or level check 216 to add additional security may cause the integrate-down rate of the integrating timer to be greater than the integrate-down rate when signals from the level check 216 and sign consistency check 214 do not indicate adding security.

The implementations of the timer as illustrated in FIGS. 6A, 6B, and 6C, exhibit different results in terms of security and dependability. For example, the integrating timer associated with the timing diagram illustrated in FIG. 6A is biased toward security in that any momentary dropout of the input would restart the timer. In this way, it is less likely that an incorrect fault determination would be made. Alternatively, the instantaneous reset timer associated with the timing diagram illustrated in FIG. 6B is biased toward dependability in that a momentary dropout results in holding the integrator and when the input picks up again, the integration starts from where it stopped. In this way, a fault is less likely to be missed by the distance element. The hybrid timer associated with the timing diagram illustrated in FIG. 6C exhibits a balance between security and dependability.

As mentioned above, to improve speed, the instantaneous operating signals may be used in the time-domain comparator 218, and to increase security, an integrating timer may be selected. Thus, a security similar to that of frequency-based methods may be achieved with less filtering and faster operation. In one embodiment, with a sampling/processing rate of 2 kHz (a sampling period of 0.5 ms) is used. In this embodiment applied to a 60 Hz system, the coincidence timer would exhibit an angular granularity of 360*0.5/16.67=10.8 degrees. This results instead of the desired 4.17 ms coincidence timing (which is associated with a 90 degree comparator angle), the logic would perform either a 4 ms or a 4.5 ms timing. In certain embodiments, this error can be reduced by higher sampling/processing rates or detecting polarity changes between samples.

In other embodiments, accuracy problems such as that introduced in the example described above, may be solved by using the coincidence timer shorter than the exact 90 degrees and supervising the time-domain comparator with a frequency-domain comparator. For example, with the above sampling and processing rates, instead of using the ideal 0.25*16.67 ms=4.17 ms, the logic may use 4.0 ms (8× the 0.5 temporal resolution). This in turn will undesirably result in the distance shape larger than the one intended with the exact 90 degrees comparator.

Figure 7:
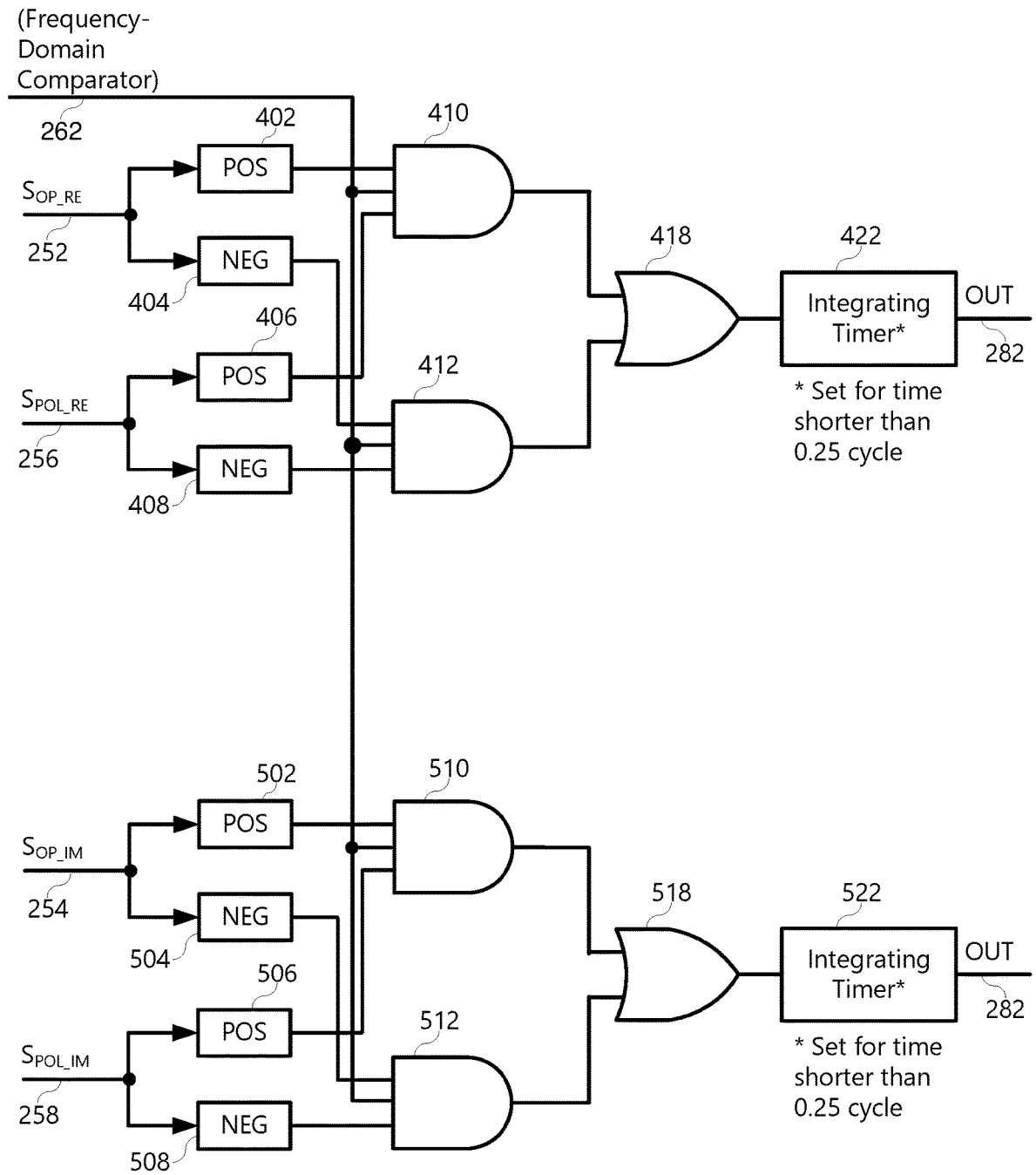
FIG. 7 illustrates a simplified block diagram of logic for time-domain distance comparator supervised by frequency-domain distance comparator according to several embodiments herein.

To solve this inaccuracy in the distance element shape, certain embodiments herein use a frequency-domain comparator to supervise the time-domain comparators. FIG. 7 illustrates a simplified block diagram of logic that may be used to supervise time-domain distance protection with frequency-domain principles in accordance with several embodiments herein. Specifically, AND gates 410, 412, 510, and 512 require, in addition to the signals described above, assertion of the signal 262 from the frequency-domain comparator in order to assert to the appropriate OR gates 418, 518 to initiate the integrating timers 422, 522. The signal 262 from the frequency-domain comparator may be from any suitable frequency-domain comparator such as those disclosed herein and illustrated and described in conjunction with FIGS. 3A, 3B, and 3C. That is, generally the signal 262 may be provided whenever the operating and polarizing signals are less than 90 degrees apart. Accordingly, the time-domain comparator is supervised by the frequency-domain comparator in that distance element does not assert (the integrating timer (e.g. 422, 522) cannot be started) unless the operating and polarizing signals are less than 90 degrees apart; and, the real and imaginary parts of the polarizing and operating signals are both positive or both negative. In certain embodiments, such as illustrated, the integrating timers 422, 522 may be configured with a time associated with 0.25 power system cycle or less.

An instantaneous operating signal 202, if only lightly filtered to maintain speed of operation, may exhibit transients in the input signals 252 and 254 for the time-domain comparators 218 and 220. As is illustrated in FIG. 2, the distance element may include further security provisions including, for example, a sign consistency check 214 to mitigate against such transients. Generally, the sign consistency check 214 checks the consistency of the sign between the instantaneous operating signal $s_{OP}$ 202 (such as, for example, the instantaneous IZ-V value) and the real part of the phasor operating signal $S_{OP\_RE}$ 252 (such as, for example, the phasor IZ-V operating signal). In various descriptions herein, the instantaneous operating signal may be referred to as the "raw" signal, where the phasor operating signal may be referred to as the "filtered" signal.

Figure 8:
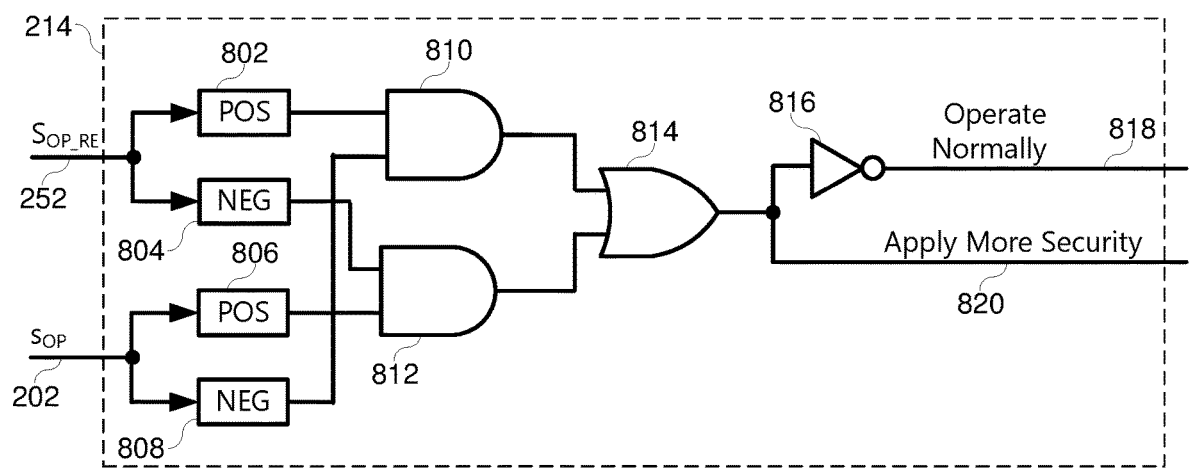
FIG. 8 illustrates a simplified block diagram of logic for implementing a sign consistency check that may be used to supervise distance comparator in accordance with several embodiments herein.

In the illustrated embodiment, the time-domain comparators 218, 220 use the sign consistency check 214 to supervise outputs 282 and 284. FIG. 8 illustrates a simplified logic diagram of a sign consistency check 214 in accordance with several embodiments. The sign consistency check 214 uses the time-domain operating signal $s_{OP}$ 202 and the real part of the frequency-domain operating signal $S_{OP\_RE}$ 252. The positive blocks 802, 806 assert when the real part of the frequency-domain operating signal $S_{OP\_RE}$ 252 and the real part of the time-domain operating signal $s_{OP}$ 202 are positive, respectively; and the negative blocks 804, 808 assert when the real part of the frequency-domain operating signal $S_{OP\_RE}$ 252 and the real part of the time-domain operating signal $s_{OP}$ 202 are negative, respectively. AND gate 810 asserts when both positive block 802 and negative block 808 assert, indicating that the real part of the frequency-domain operating signal $S_{OP\_RE}$ 252 is positive while the time-domain operating signal $s_{OP}$ 202 is negative (i.e. the two signals concurrently have opposite signs). Similarly, AND gate 812 asserts when negative block 804 and positive block 806 assert, indicating that the real part of the frequency-domain operating signal $S_{OP\_RE}$ 252 is negative while the time-domain operating signal $s_{OP}$ 202 is positive (i.e. the two signals concurrently have opposite signs). In sum, AND gates 810 or 812 assert when the signs of the operating signals are opposite. Upon assertion of either AND gate 810 or 812, then OR gate 814 asserts. Output of the OR gate is inverted 816 such that when the signs of the operating signals the same sign, then the sign consistency operate signal 818 is asserted. Otherwise, when the signs are opposite, then a signal to apply additional security 820 is asserted. Accordingly, the sign consistency check 214 allows for normal operation when the signs of the operating signals are not opposite, but requires additional security when the signs are opposite.

In terms of raw and filtered signals, the logic of FIG. 8 compares the signs of the raw and filtered signals. If the signs agree (both are positive or both are negative), then the operating signal may be trusted, and the distance is allowed to operate normally 818, even if the values of the signals disagree (indicating that transients may be still present in the signals). Further, transients that lead to sign disagreement are treated as potential threats to security, and result in the signal 820 to apply additional security.

The signal 818 to operate normally may be implemented as allowing the integrators (such as, for example, integrating timers 414, 416, 422, 514, 516, 522) to operate normally. The signal for application of additional security 820 may be implemented as de-asserting the inputs to the integrating timers with the effect of causing them to reset or integrate down—depending on the timing scheme explained in FIG. 6—for extra security.

Figure 9:
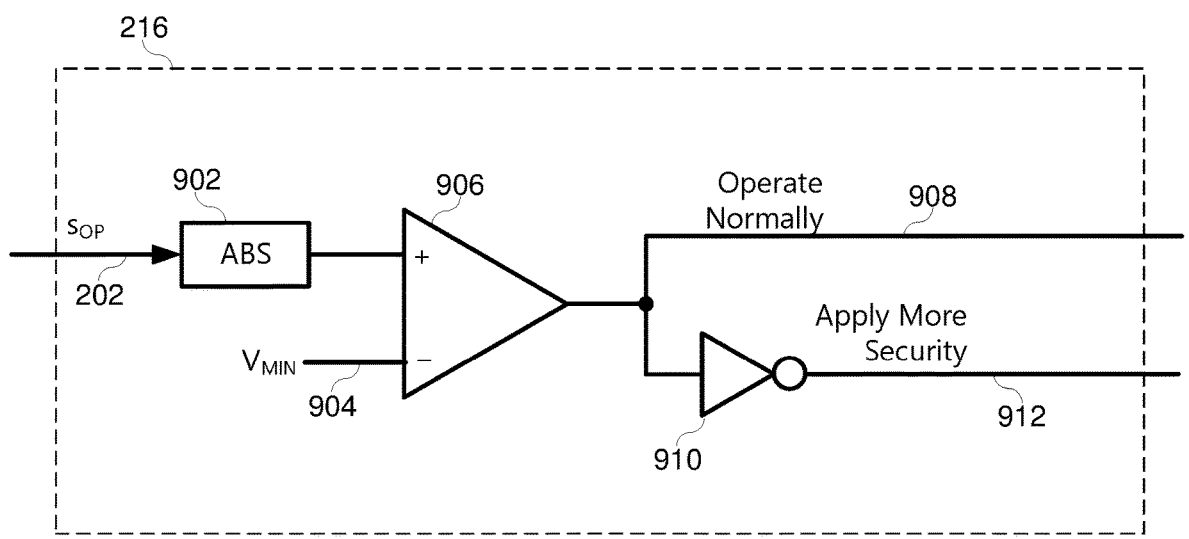
FIG. 9 illustrates a simplified block diagram of logic for implementing a level check that may be used to supervise distance comparator in accordance with several embodiments herein.

Returning now to the additional security checks, a level check 216 may check a level of the operating signal to supervise the output of the distance element. FIG. 9 illustrates a simplified block diagram of logic that may be used for a level check consistent with several embodiments hereof. The level of the time-domain operating signal $s_{OP}$ 202 must be above a predetermined level to assert an "operate normally" signal. In principle, the operating signal of a reach-sensitive distance comparator (mho, reactance) is ideally zero for metallic faults at the reach point, and increases as the fault location is more distant from the reach point, either inside or outside of the distance zone. Thus, the smaller the operate signal, the closer the fault is to the reach point, and the more security is needed to determine if the fault is inside or outside of the zone of protection. If the operate signal is large, it must be either far outside of the zone of protection, or far inside of the zone of protection. When the operate signal is small, however, the signal-to-noise ratio worsens and more security is required. Using the level of the operate signal has an added benefit of accelerating operation when the fault is close in (the operate signal is large), and slowing down operation in weak systems or when the fault is near the reach point to maintain security. It should be noted that the individual levels of the voltage or current signals separately do not include much information about the need for extra security, but instead it is the level of the operate signal that includes information as to whether the signal-to-noise ratio may become a problem. Noise may be, for example, unfiltered transients from the power system (as opposed to A/D converter noise or noise in relay electronics).

FIG. 9 illustrates logic of one embodiment of a level check that may be used. In the illustrated embodiment, the level of the operate signal is checked against a predetermined threshold. Specifically, a magnitude (absolute value 902) of the time-domain operate signal $s_{OP}$ 202 is determined and presented to comparator 906. The comparator 906 compares the magnitude against a predetermined threshold $V_{MIN}$ 904. In alternative embodiments, a phasor magnitude ($S_{OP\_RE}+jS_{OP\_IM}$) may be compared against a predetermined threshold. When the magnitude of the operate signal $s_{OP}$ 202 (or the operate phasor, respectively) exceeds the predetermined threshold 904, then comparator asserts. Upon assertion of the comparator 906, the level-check operate signal ("operate normally") 908 signal is provided by the level check block 216. As above, the operate normally 908 signal allows the distance element to proceed without additional security. Alternatively, when comparator 906 is not asserted (the level of the operate signal $s_{OP}$ 202 does not exceed the predetermined threshold 904), then the signal from the comparator 906 is inverted, 910, thus asserting the additional security signal 912. The additional security signal 912 may be used by the distance element to increase security due to the level of the operating signal being less than the predetermined threshold. As with the signal 812, the additional security signal 912 may be used by the integrating timers to deassert, which may result in counting downward (or backward) when deasserted, to increase security.

Figure 10:
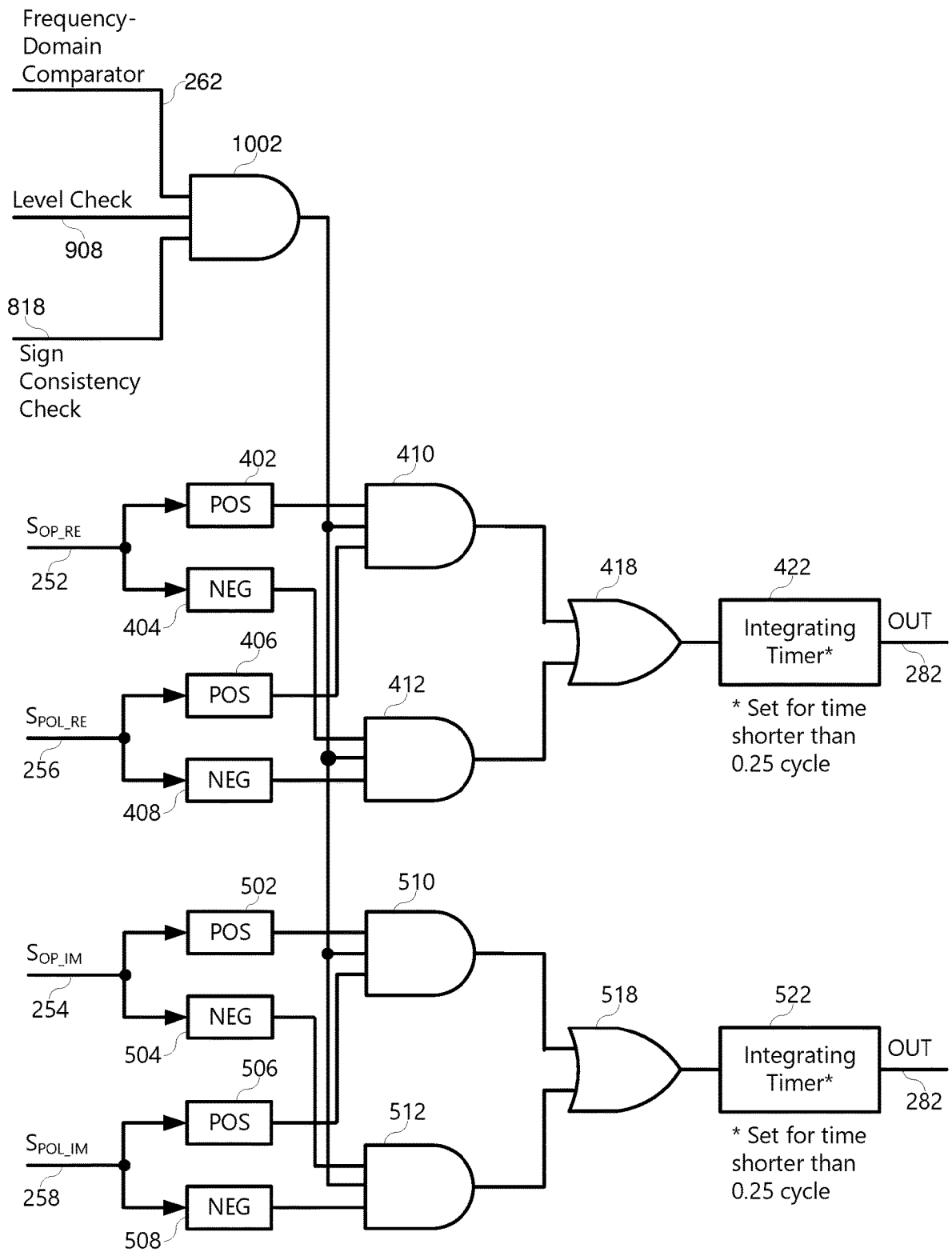
FIG. 10 illustrates a simplified block diagram of logic for time-domain distance comparator supervised by frequency-domain distance comparator, sign consistency, and operating signal level according to several embodiments herein.

FIG. 10 illustrates a simplified block diagram of logic that may be used to implement security in a distance element using the frequency-domain comparator, the level check, and the sign consistency check. And gate 902 asserts upon presence of all of: 1) the frequency-domain comparator signal 262, indicating that the frequency-domain reach-sensitive comparator 222 has detected a fault within the zone of protection; 2) the signal to operate normally 818 from the sign consistency check 214; and, 3) the signal to operate normally 908 from the level check 216. AND gates 410, 412, 510, 512 assert only if the signal from AND gate 902 is asserted, in addition to the conditions for assertion detailed above. Accordingly, the frequency-domain comparator, level check, and the sign consistency check act as added security to the time-domain comparators in several embodiments.

In alternative embodiments, different logical tools may be used for additional or reduced security. For example, the AND gate 902 may be replaced by an OR gate, such that one or more of the frequency-domain comparator signal 262, level check 908, or the sign consistency check signal 818 are required for AND gates 410, 412, 510, or 512 to assert, in addition to the signals from the positive and negative blocks as detailed above.

In yet another embodiment, the sign consistency check may be used to assert two different and parallel integrating timers. The operate normally signal 818 may be used in a first integrating timer of the time-domain comparators to integrate a first operate signal, and the signal to apply additional security 820 may be used in a second integrating timer of the time-domain comparators to integrate a second operate signal (both assuming that the other conditions for starting and running the integrating timers are also met). The outputs of the first and second integrating timers may be used to determine if a fault is detected 262. For example, the second integrating timer (associated with the additional security signal 820) may require a higher operate threshold (longer assert time), thus adding some additional security. In this example, the output indicating a fault detected 262 may be asserted if either the first or second integrating timers assert their outputs.

In various situations, a comparator may be asserted prior to a fault. For example, where a quadrilateral element is used, a reactance comparator may be asserted before the fault. For such, the load impedance is typically below the reactance setpoint. If so, the load will assert the output of the reactance comparator. A mho comparator under heavy load conditions may assert as well (the mho distance element is not operating because it is typically blocked by the load encroachment logic, but the mho comparator itself may be permanently asserted on load). If the mho or reactance comparator is permanently asserted on load, it may have less security margin for a subsequent fault external to the zone of distance protection. The integrating timers are at non-zero values due to the pre-fault load and they may integrate up and operate faster than when integrating from zero.

Figure 11:
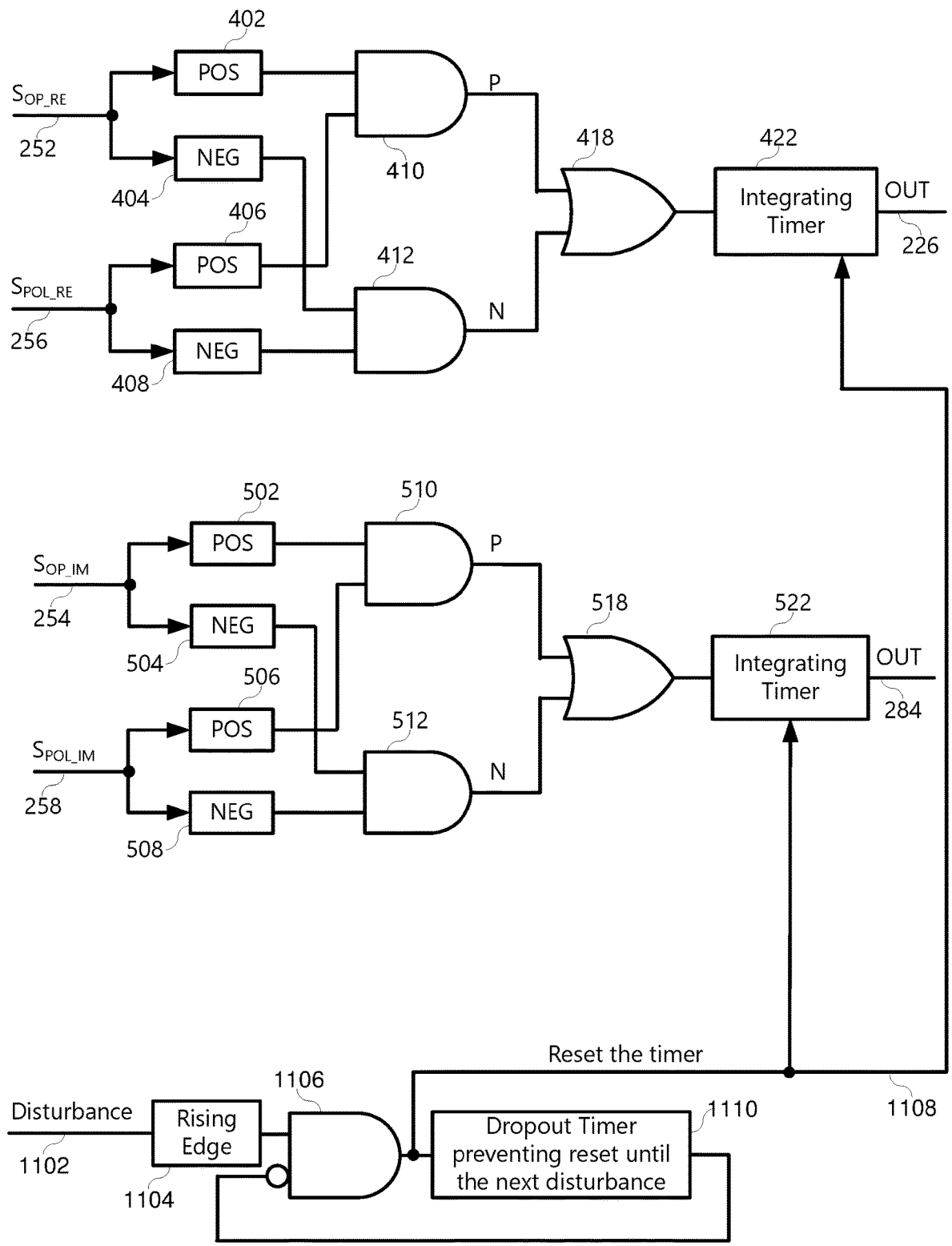
FIG. 11 illustrates a simplified block diagram of logic for time-domain distance comparator controlled by a disturbance detector in accordance with several embodiments herein.

To address such pre-fault integrating, a disturbance detector may be used to reset integrating timers. FIG. 11 illustrates a simplified block diagram of logic useful for resetting integrating timers using a disturbance detector. Specifically, if a disturbance is detected 1102, upon a rising edge of the disturbance 1104 (and non-assertion of a dropout timer 1110), AND gate 1106 asserts the signal 1108 to reset the integrating timer(s) 422, 522. A dropout timer 1110 may be used to prevent a reset during an on-going power system event until the next power system event.

Figure 12:
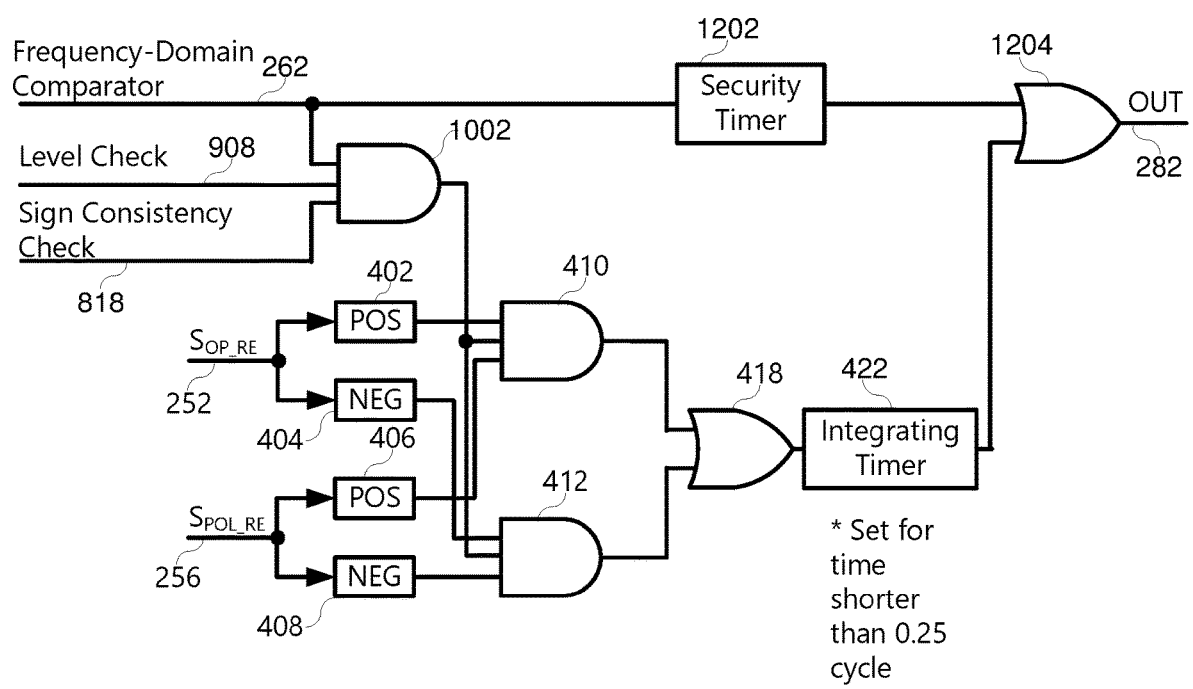
FIG. 12 illustrates a simplified block diagram of logic for overriding time-domain distance comparator when frequency-domain distance comparator asserts for a delay time, in accordance with several embodiments herein.

As described above, when the operating signal is small, the operation of the distance element for faults within the zone of protection may be delayed or prevented. It may be beneficial, therefore to allow operation based on the frequency-domain comparator alone, but using a sufficiently long time delay for security. FIG. 12 illustrates a simplified block diagram of logic that may be used to implement the frequency-only solution with security timer. Similar to the embodiments illustrated in FIG. 10, the AND gate 1002 asserts when all three of the frequency-domain comparator asserts 262, the sign consistency check asserts 818, and the level check asserts 908. Upon assertion of the frequency-domain comparator 262, the security timer 1202 is also initiated. If either the integrating timer 422 (or other integrating timer such as 414, 416, 514, 516, 522, not specifically illustrated in this block diagram), or the security timer 1202, the distance fault detection signal 226 is asserted by OR gate 1204. Accordingly, even if the fault is not detected to be within the zone of protection by the reach-sensitive time-domain (real or imaginary parts) comparators, 218, 220, the frequency-domain comparator can be used to assert the output distance fault detection signal 226 upon sufficiently long time delay. The security timer 1202 may include a predetermined time delay to ensure that the frequency-domain comparator is asserted for a sufficient amount of time to ensure security. The security timer 1202 may be implemented as an instantaneous reset timer, an integrating timer, or hybrid, as described herein.

Figure 13:
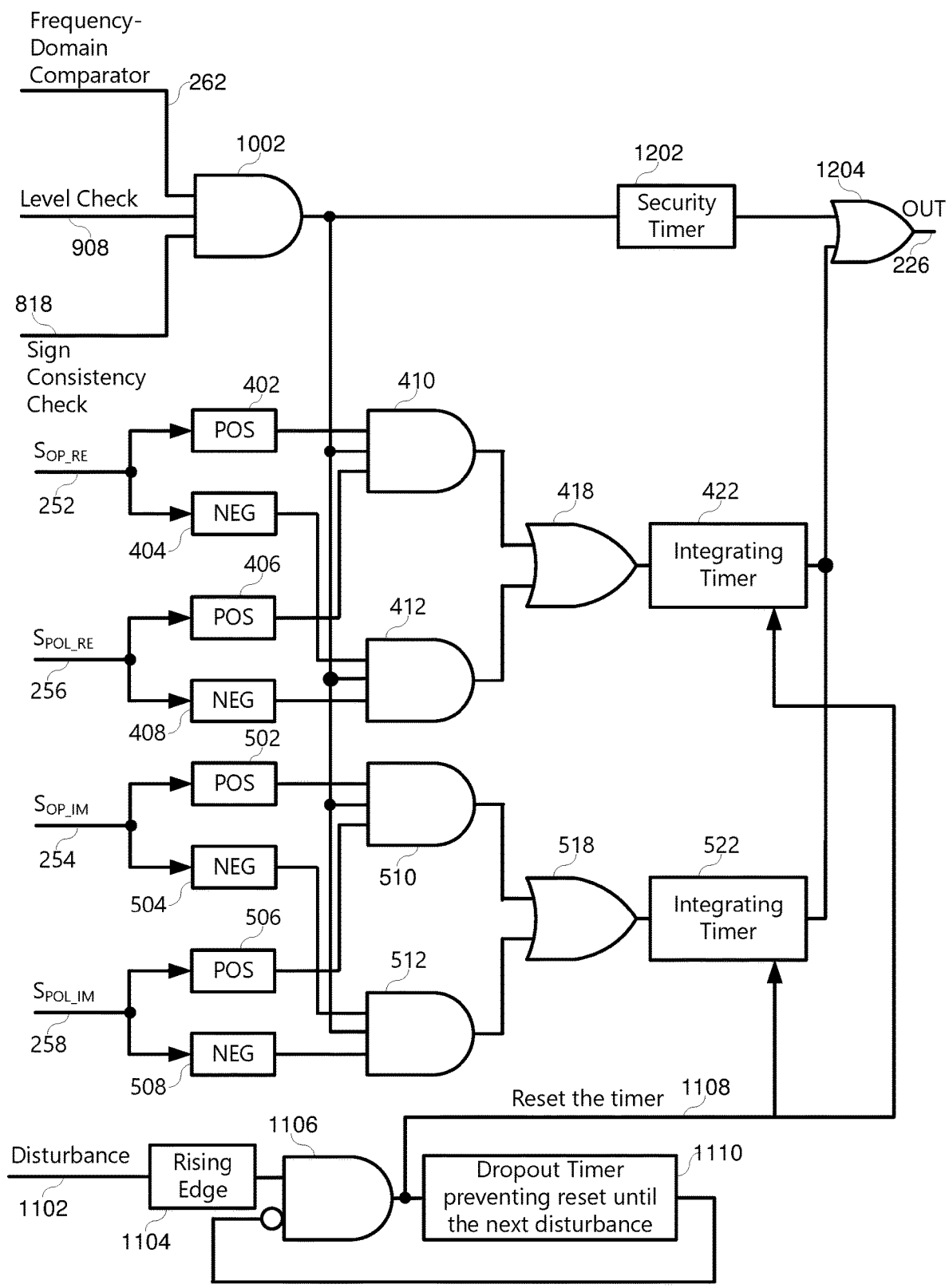
FIG. 13 illustrates a simplified block diagram of logic for distance comparator detection with supervision and time-domain overriding logic in accordance with several embodiments herein.

For completeness, FIG. 13 illustrates a simplified block diagram of logic that may be used to detect a fault within a zone of protection (assert distance fault detection signal 262) using both frequency-domain and time-domain principles. It should be noted that similar logic as that illustrated may be applied to various comparators such as, for example, mho and reactance distance comparators to achieve the benefits of speed and security. That is, the frequency-domain comparator may be replaced by a mho or reactance distance comparator. Similarly, the time-domain comparators may be replaced by matching mho or reactance distance comparators. Furthermore, the logic may be used with comparators or elements that are not sensitive to reach.

The disclosure of the embodiments herein may apply the sign consistency check to the real part of the operating signal, but, in various embodiments, not to the imaginary part (e.g., the output from 818 may not flow to AND gates 510, 512). This comparison is convenient because the instantaneous operating signal $s_{OP}$ is time-coherent with the real part of the filtered operating signal $S_{OP\_RE}$ and the two can be directly compared. To compare the imaginary part of the frequency-domain operating signal $S_{OP\_IM}$ for sign consistency, it would require calculation of the time derivative of the $s_{OP}$ signal. The operation of taking a time derivative increases noise and that noise may lead to incorrect signaling (i.e. asserting the need for more security when it is not necessary). However, in accordance with several embodiments herein, the sign consistency check may be applied to one, both, or neither of the real and imaginary time-domain comparators 218, 220.

In addition, although FIG. 9 illustrates a level check of an operating signal (e.g. $s_{OP}$ 202 as illustrated, or even $S_{OP\_RE}$ 252, or $S_{OP\_IM}$ 254), the polarizing signals may also be subject to a level check, following the same logic as is illustrated. That is, any, all, or none of the polarizing signals $s_{POL}$ 204, $S_{POL\_RE}$ 256, or $S_{POL\_IM}$ 258 may be subject to a level check similar to that illustrated in FIG. 9. Such check of the polarizing signal is especially beneficial to reactance comparators that use zero- or negative-sequence currents for polarizing.

While specific embodiments and applications of the disclosure have been illustrated and described, it is to be understood that the disclosure is not limited to the precise configurations and components disclosed herein. Moreover, principles described herein may also be utilized for protecting an electric system from over-frequency conditions, wherein power generation would be shed rather than load to reduce effects on the system. Accordingly, many changes may be made to the details of the above-described embodiments without departing from the underlying principles of this disclosure. The scope of the present invention should, therefore, be determined only by the following claims.

What is claimed is:

1. A system to determine a fault within a zone of protection of an electric power delivery system, comprising:
    a signal processor to calculate a frequency-domain operating quantity, and a frequency-domain polarizing quantity;
    a frequency-domain distance fault detector to:
        compare the frequency-domain operating quantity and the frequency-domain polarizing quantity; and
        when the frequency-domain operating quantity and frequency-domain polarizing quantity are within a predetermined range of each other, assert a frequency-domain fault detection signal;
    a time-domain distance fault detector to:
        calculate a time-domain operating quantity;
        calculate a time-domain polarizing quantity;
        determine a coincidence time that signs of the time-domain operating and polarizing quantities are the same;
        when the coincidence time reaches a predetermined coincidence time threshold, assert a time-domain fault detection signal; and,
        assert a distance fault detection signal when the frequency-domain fault detection signal is asserted and the time-domain fault detection signal is asserted; and,
    a monitored equipment interface in communication with the electric power delivery system to effect a protective action in the electric power delivery system upon assertion of the distance fault detection signal.

2. The system of claim 1, wherein the time-domain distance fault detector is further configured to:
    calculate a real portion of the frequency-domain operating quantity;

calculate a real portion of the frequency-domain polarizing quantity;
determine a coincidence time that signs of the real portions of the frequency-domain operating and polarizing quantities are the same; and,
wherein when the coincidence time of the real portions of the frequency-domain operating and polarizing quantities are the same, assert the time-domain fault detection signal.

3. The system of claim 1, wherein the time-domain distance fault detector is further configured to:
calculate an imaginary portion of the frequency-domain operating quantity;
calculate an imaginary portion of the frequency-domain polarizing quantity;
determine a coincidence time that signs of the imaginary portions of the frequency-domain operating and polarizing quantities are the same; and,
wherein when the coincidence time of the imaginary portions of the frequency-domain operating and polarizing quantities are the same or when the coincidence time of the real portions of the frequency-domain operating and polarizing quantities are the same, assert the time-domain fault detection signal.

4. The system of claim 1, wherein the predetermined range of the frequency-domain distance fault detector comprises 90 degrees.

5. The system of claim 1, wherein the predetermined coincidence time threshold comprises a time associated with a quarter of a power-system cycle.

6. The system of claim 1, wherein the time-domain distance fault detector comprises an integrating timer to determine the coincidence time.

7. The system of claim 6, wherein the frequency-domain operating quantity comprises a real portion of the frequency-domain operating quantity;
and further comprising a sign consistency check to:
determine when a sign of the real portion of the frequency-domain operating quantity coincides with a sign of a time-domain operating signal; and
signal the integrating timer to integrate down when the sign of the real portion of the frequency-domain operating quantity coincides with the sign of the time-domain operating quantity.

8. The system of claim 1, wherein the frequency-domain operating quantity comprises a real portion of the frequency-domain operating quantity;
and further comprising a sign consistency check to:
assert a sign consistency operate signal when:
a sign of the real portion of the frequency-domain operating quantity coincides with a sign of a time-domain operating quantity; and
wherein the distance fault detection signal is only asserted when the sign consistency operate signal is asserted.

9. The system of claim 6, wherein the time-domain distance fault detector further comprises a level check to:
determine when a magnitude of the time-domain operating quantity exceeds a predetermined minimum operating quantity threshold; and
signal the integrating timer to integrate down when the magnitude of the time-domain operating quantity exceeds the predetermined minimum operating signal threshold.

10. The system of claim 1, wherein the time-domain distance fault detector further comprises a level check to:
assert a level check operate signal when:
a magnitude of the time-domain operating quantity exceeds a predetermined minimum operating quantity threshold; and
wherein the distance fault detection signal is only asserted when the level check operate signal is asserted.

11. The system of claim 1, further comprising a disturbance detector to detect a power system disturbance and output a disturbance signal upon detection of the power system disturbance.

12. The system of claim 11, wherein the time-domain distance fault detector comprises an integrating timer to determine the coincidence time, and upon assertion of the disturbance signal, the integrating timer resets.

13. The system of claim 1, further comprising a frequency-domain timer with a predetermined frequency-domain security time, wherein the fault detection signal is only asserted upon assertion of the frequency-domain fault detection signal for a predetermined frequency-domain security time.

14. The system of claim 1, wherein the coincidence time comprises a time that the signs of the time-domain operating quantities are the same and the frequency-domain fault detection signal is asserted.

15. A method to determine a fault within a zone of protection of an electric power delivery system, comprising:
an intelligent electronic device in communication with the electric power delivery system calculating a frequency-domain operating quantity;
calculating a frequency-domain polarizing quantity;
calculating a time-domain operating quantity;
calculating a time-domain polarizing quantity;
comparing the frequency-domain operating quantity and the frequency-domain polarizing quantity;
comparing signs of the time-domain operating quantity and the time-domain polarizing quantity;
asserting a distance fault detection signal when, for a predetermined coincidence time,
the frequency-domain operating quantity and frequency-domain polarizing quantity are within a predetermined range; and,
the time-domain operating quantity and the time-domain polarizing quantity have the same sign; and,
effecting a protective action in the electric power delivery system upon assertion of the fault detection signal.

16. The method of claim 15, wherein the predetermined coincidence time comprises a time associated with a quarter of a power-system cycle.

17. The method of claim 15, wherein the step of asserting the fault detection signal comprises asserting when a real portion of the frequency-domain operating quantity and a real portion of the frequency-domain polarizing quantity are within the predetermined range.

18. The method of claim 15, wherein the step of asserting the fault detection signal comprises asserting when an imaginary portion of the frequency-domain operating quantity and an imaginary portion of the frequency-domain polarizing quantity are within the predetermined range.

19. The method of claim 15, further comprising:
determining when a magnitude of the time-domain operating quantity exceeds a predetermined minimum operating signal threshold; and
integrating the coincidence time down when the magnitude of the time-domain operating quantity exceeds the predetermined minimum operating quantity threshold.

20. The method of claim 15 further comprising:
calculating a real portion of the frequency-domain operating quantity;

comparing a sign of the real portion of the frequency-domain operating quantity with a sign of the time-domain operating quantity; and asserting the distance fault detection signal only when the sign of the real portion of the frequency-domain operating quantity coincides with the sign of the time-domain operating quantity.

21. The method of claim 15, further comprising:

detecting a disturbance on the electric power delivery system; and upon detecting the disturbance, the distance fault detection signal is not asserted.

* * * * *